United States Patent
Lu et al.

(10) Patent No.: US 10,923,197 B2
(45) Date of Patent: *Feb. 16, 2021

(54) MEMORY DEVICE WITH COMPENSATION FOR ERASE SPEED VARIATIONS DUE TO BLOCKING OXIDE LAYER THINNING

(71) Applicant: SanDisk Technologies LLC, Addison, TX (US)

(72) Inventors: Ching-Huang Lu, Fremont, CA (US); Ashish Baraskar, Santa Clara, CA (US); Vinh Diep, San Jose, CA (US)

(73) Assignee: SanDisk Technologies LLC, Addison, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/922,037

(22) Filed: Jul. 7, 2020

(65) Prior Publication Data
US 2020/0335168 A1  Oct. 22, 2020

Related U.S. Application Data

(63) Continuation of application No. 16/280,297, filed on Feb. 20, 2019, now Pat. No. 10,741,253.

(51) Int. Cl.
*G11C 11/34* (2006.01)
*G11C 16/14* (2006.01)
(Continued)

(52) U.S. Cl.
CPC .......... *G11C 16/14* (2013.01); *G11C 16/0483* (2013.01); *G11C 16/3445* (2013.01);
(Continued)

(58) Field of Classification Search
CPC ..... G11C 16/16; G11C 16/14; G11C 16/3445; G11C 16/244; G11C 16/0483; G11C 16/3472
(Continued)

(56) References Cited

U.S. PATENT DOCUMENTS 7,869,280 B2   1/2011   Kosaki et al.
9,019,775 B2   4/2015   Costa
(Continued)

FOREIGN PATENT DOCUMENTS

EP   2589070 A2   5/2013

OTHER PUBLICATIONS

Zhao, et al., "Review on non-volatile memory with high-k dielectrics: Flash for generation beyond 32 mm," Materials 7, No. 7, Jul. 7, 2014, 29 pages.
(Continued)

*Primary Examiner* — Son T Dinh
(74) *Attorney, Agent, or Firm* — Vierra Magen Marcus LLP

(57) ABSTRACT

Techniques are provided for optimizing an erase operation in a memory device to compensate for erase speed variations due to blocking oxide thinning In an erase operation for a block, the channels of NAND strings in different sub-blocks can be charged up by different amounts. One approach adjusts the control gate voltage of a first select gate transistor in a NAND string. This adjusts the amount of holes generated in the channel due to gate-induced drain leakage. Another approach adjusts the control gate voltage of additional select gate transistors in the NAND string to adjust the conductivity of the adjacent channel regions. Another approach applies different bit line voltages to different rows of NAND strings in each sub-block.

20 Claims, 24 Drawing Sheets

(51) Int. Cl.
*G11C 16/04* (2006.01)
*H01L 27/1157* (2017.01)
*G11C 16/34* (2006.01)
*H01L 27/11578* (2017.01)

(52) U.S. Cl.
CPC ...... *G11C 16/3472* (2013.01); *H01L 27/1157* (2013.01); *H01L 27/11578* (2013.01)

(58) Field of Classification Search
USPC ...................................... 365/185.29, 185.18
See application file for complete search history.

(56) References Cited

U.S. PATENT DOCUMENTS

| | | | |
|---|---|---|---|
| 9,343,156 B1 | 5/2016 | Mui et al. | |
| 9,343,159 B2 | 5/2016 | Dong et al. | |
| 9,449,698 B1 | 9/2016 | Paudel et al. | |
| 9,711,229 B1 | 7/2017 | Rabkin et al. | |
| 9,786,378 B1 | 10/2017 | Zhang et al. | |
| 10,090,054 B2 | 10/2018 | Maeda | |
| 10,741,253 B1 * | 8/2020 | Lu | G11C 16/0483 |
| 2008/0158994 A1 | 7/2008 | Yang | |
| 2008/0290400 A1 | 11/2008 | Jenne et al. | |
| 2010/0002513 A1 | 1/2010 | Lutze et al. | |
| 2011/0003452 A1 | 1/2011 | Lai et al. | |
| 2014/0119121 A1 | 5/2014 | Aritome | |
| 2014/0247668 A1 | 9/2014 | Costa et al. | |
| 2017/0229188 A1 | 8/2017 | Kim | |
| 2018/0240527 A1 | 8/2018 | Zhang et al. | |
| 2018/0374551 A1 * | 12/2018 | Hu | G11C 16/349 |

OTHER PUBLICATIONS

International Search Report & The Written Opinion of the International Searching Authority dated Mar. 11, 2020, International Application No. PCT/US2019/063705.

U.S. Appl. No. 16/280,297, filed Feb. 20, 2019.

Non-final Office Action dated Apr. 2, 2020, U.S. Appl. No. 16/280,297, filed Feb. 20, 2019.

Response to Office Action dated May 13, 2020, U.S. Appl. No. 16/280,297, filed Feb. 20, 2019.

Notice of Allowance dated Jun. 4, 2020, U.S. Appl. No. 16/280,297, filed Feb. 20, 2019.

* cited by examiner

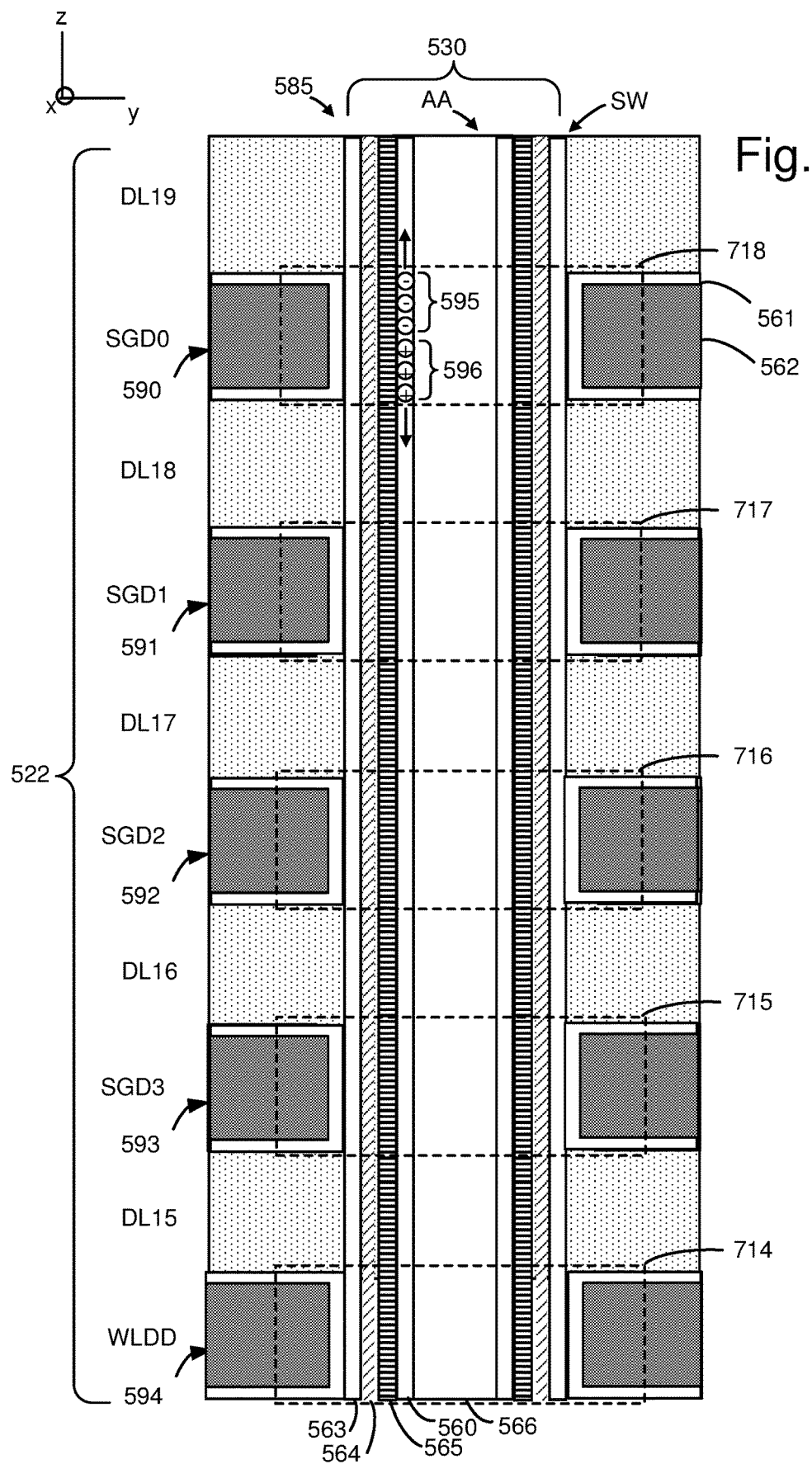

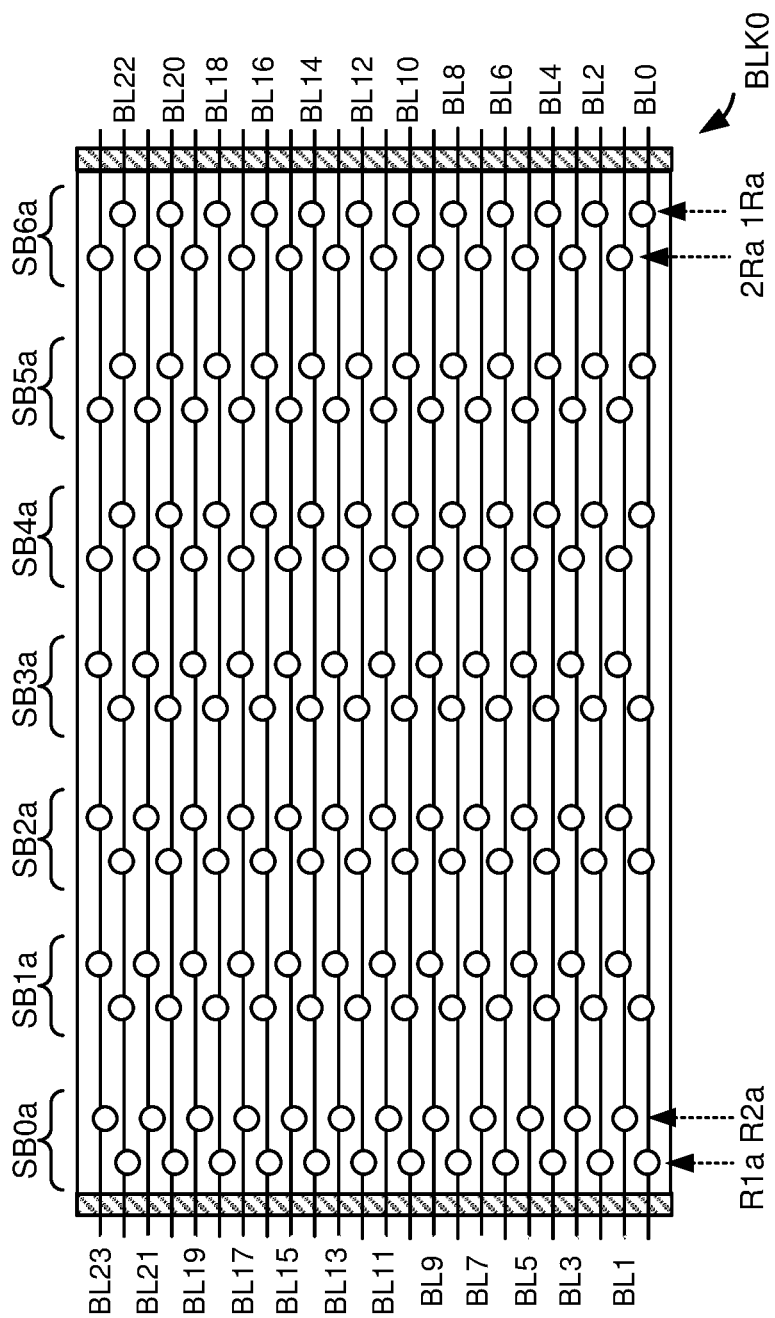

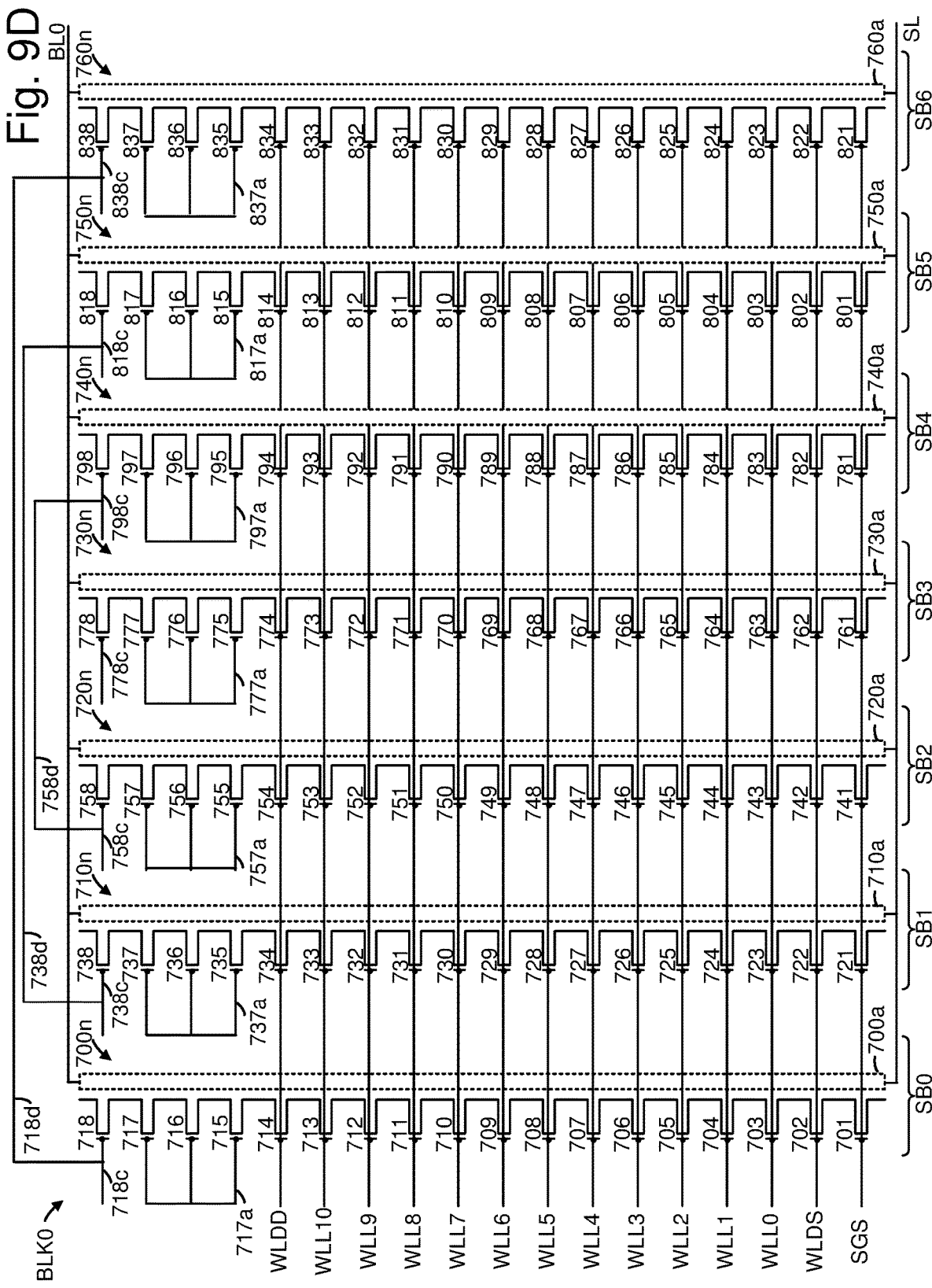

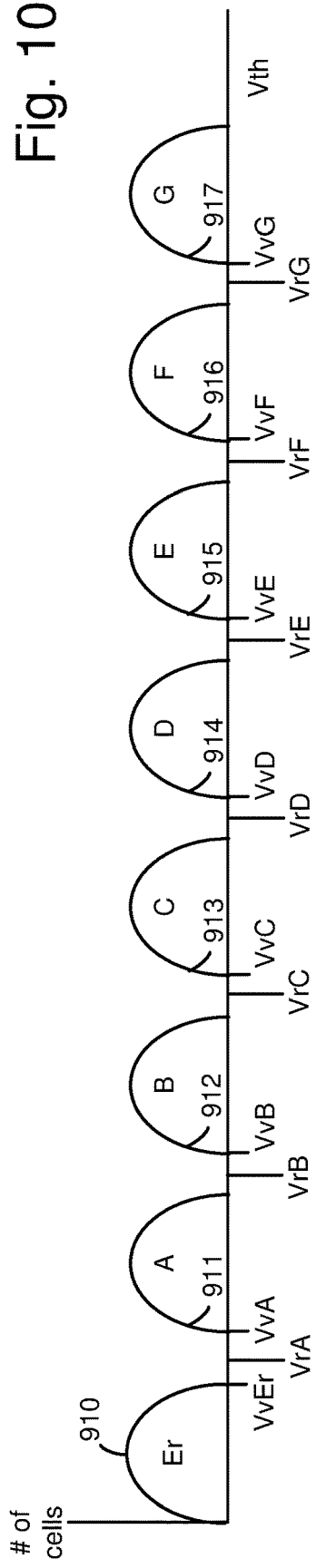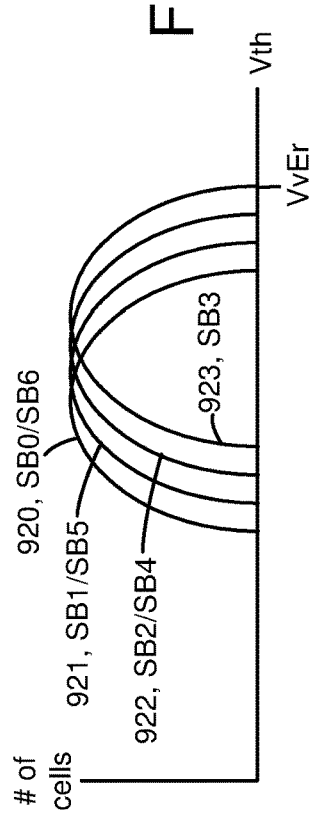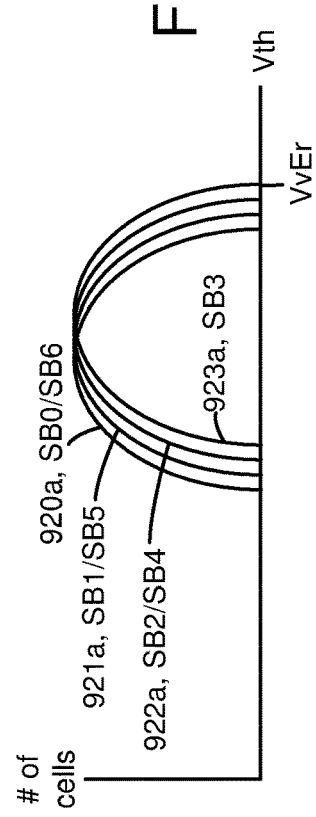

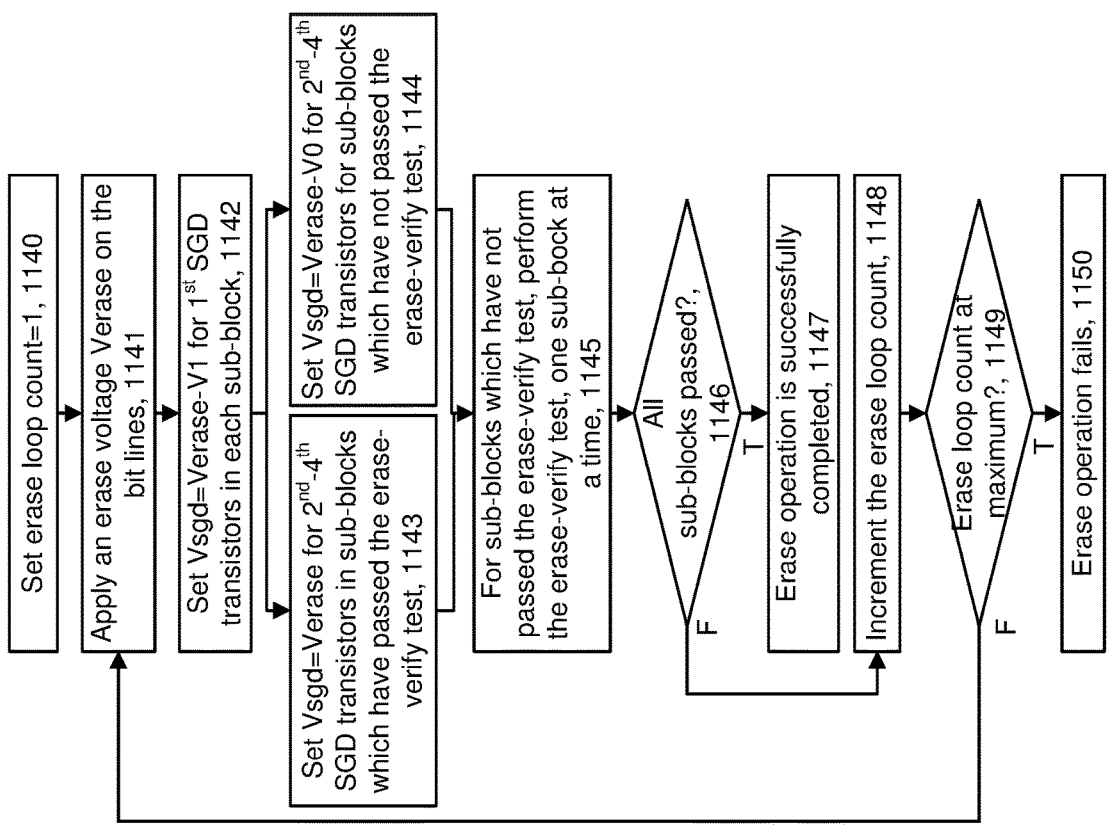
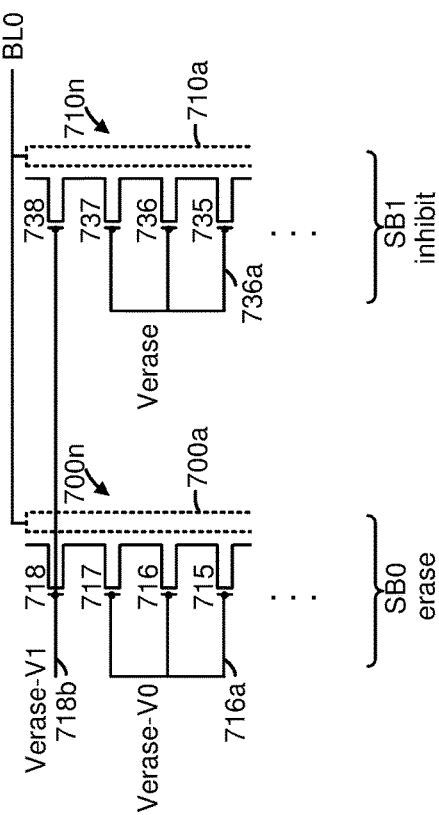

Fig. 12A

|         | SB0/SB6 | SB1/SB5  | SB2/SB4   | SB3  |
|---------|---------|----------|-----------|------|
| Vsgd0-3 | 15 V    | 14 V     | 13 V      | 12 V |
| GIDL    | low     | med.-low | med.-high | high |
| Vch     | low     | med.-low | med.-high | high |

Fig. 12B

|          | SB0/SB6 | SB1/SB5  | SB2/SB4   | SB3  |
|----------|---------|----------|-----------|------|
| Vsgd0    | 10 V    | 10 V     | 10 V      | 10 V |
| GIDL     | high    | high     | high      | high |
| Vsgd1-3  | 15 V    | 14 V     | 13 V      | 12 V |
| SGD cond.| low     | med.-low | med.-high | high |
| Vch      | low     | med.-low | med.-high | high |

Fig. 12C

|          | SB0/SB6 | SB1/SB5  | SB2/SB4   | SB3  |
|----------|---------|----------|-----------|------|
| Vsgd0    | 15 V    | 14 V     | 13 V      | 12 V |
| GIDL     | low     | med.-low | med.-high | high |
| Vsgd1-3  | 10 V    | 10 V     | 10 V      | 10 V |
| SGD cond.| low     | low      | low       | low  |
| Vch      | low     | med.-low | med.-high | high |

Fig. 12D

|          | SB0/SB6 | SB1/SB5  | SB2/SB4   | SB3  |
|----------|---------|----------|-----------|------|
| Vsgd0    | 15 V    | 14 V     | 13 V      | 12 V |
| GIDL     | low     | med.-low | med.-high | high |
| Vsgd1-3  | 15 V    | 14 V     | 13 V      | 12 V |
| SGD cond.| low     | med.-low | med.-high | high |
| Vch      | low     | med.-low | med.-high | high |

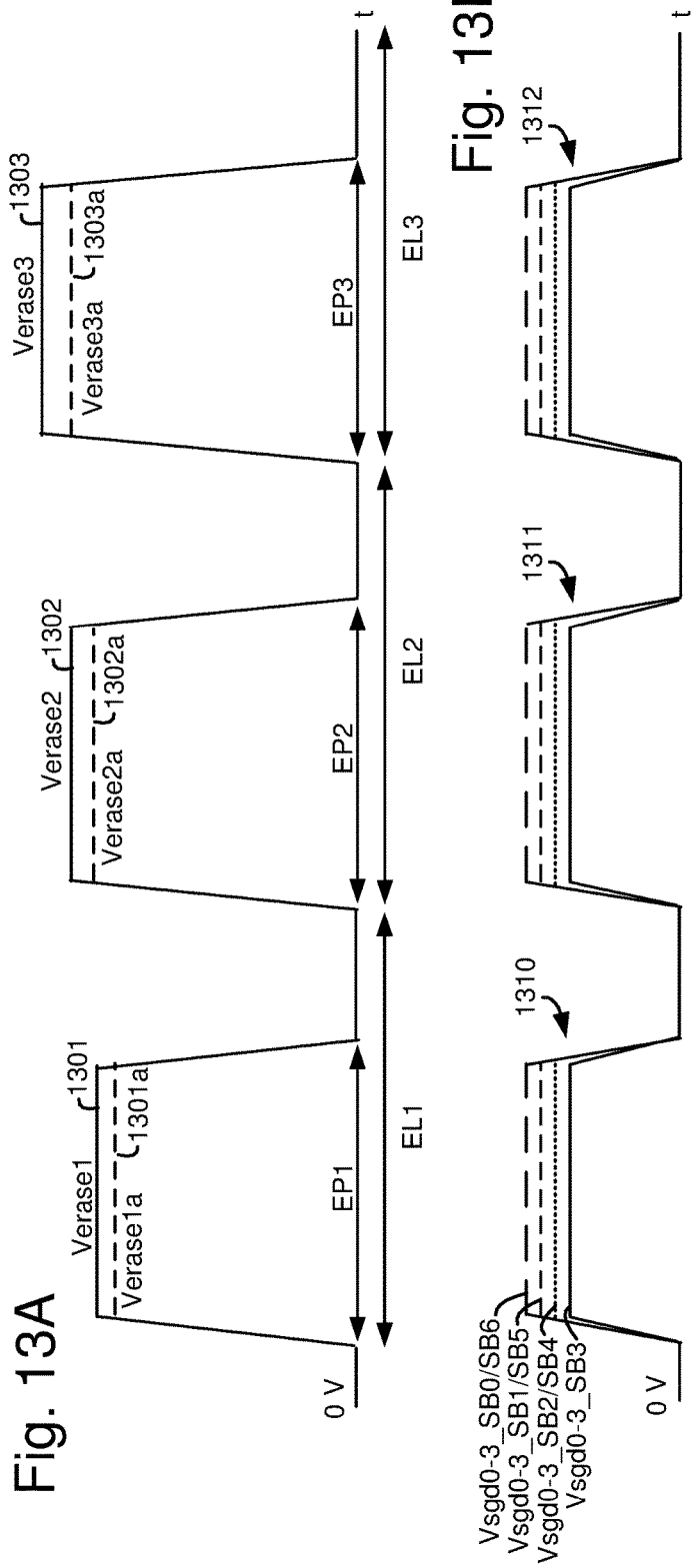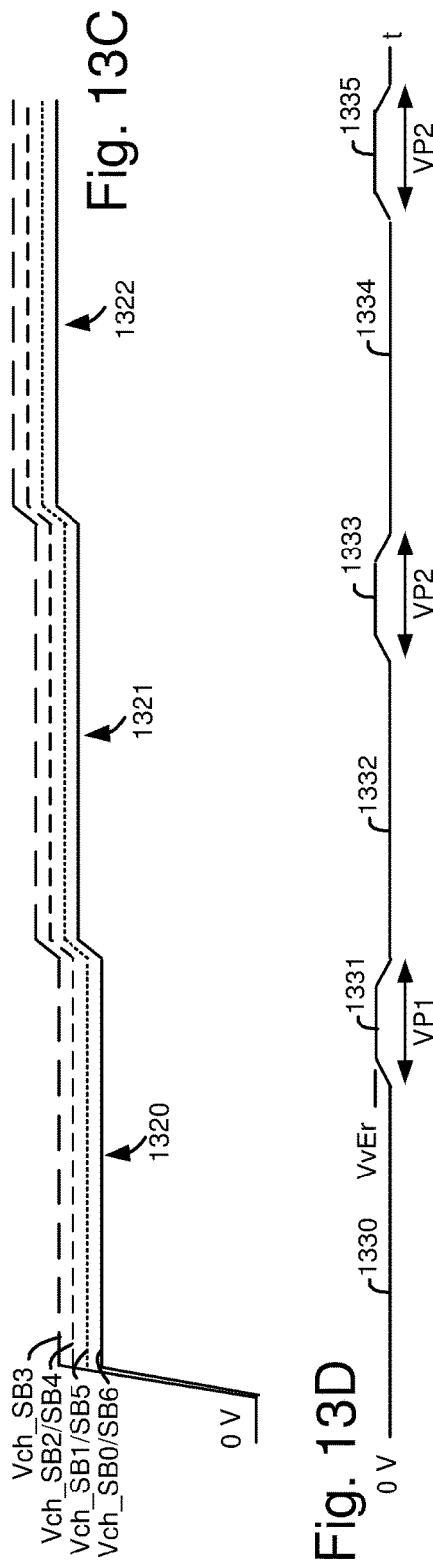

MEMORY DEVICE WITH COMPENSATION FOR ERASE SPEED VARIATIONS DUE TO BLOCKING OXIDE LAYER THINNING

CLAIM OF PRIORITY

This application is a continuation application of U.S. patent application Ser. No. 16/280,297, published as US 2020/0265897 on Aug. 20, 2020 and issued as U.S. Pat. No. 10,741,253 on Aug. 11, 2020, entitled "Memory Device With Compensation For Erase Speed Variations Due To Blocking Oxide Layer Thinning," by Lu et al., filed Feb. 20, 2019, incorporated by reference herein in its entirety.

BACKGROUND

The present technology relates to the operation of memory devices.

Semiconductor memory devices have become more popular for use in various electronic devices. For example, non-volatile semiconductor memory is used in cellular telephones, digital cameras, personal digital assistants, mobile computing devices, non-mobile computing devices and other devices.

A charge-storing material such as a floating gate or a charge-trapping material can be used in such memory devices to store a charge which represents a data state. A charge-trapping material can be arranged vertically in a three-dimensional (3D) stacked memory structure, or horizontally in a two-dimensional (2D) memory structure. One example of a 3D memory structure is the Bit Cost Scalable (BiCS) architecture which comprises a stack of alternating conductive and dielectric layers.

A memory device includes memory cells which may be arranged in series, in NAND strings (e.g., NAND chains), for instance. However, various challenges are presented in operating such memory devices.

BRIEF DESCRIPTION OF THE DRAWINGS

FIG. 6 depicts a close-up view of the region 522 of the stack of FIG. 5A.

FIG. 8D depicts another example top view of the example block BLK0 of FIG. 7A, where each sub-block comprise two rows of NAND strings.

FIG. 9D depicts a fourth example configuration of select gate transistors in the block BLK0 of FIG. 7B.

FIG. 10A depicts threshold voltage (Vth) distributions of a set of memory cells after a program operation.

FIG. 10B depicts Vth distributions of memory cells of different sub-blocks which have different erase speeds at the end of an erase operation, when a relatively large erase voltage duration and a relatively small number of erase loops are used.

FIG. 10C depicts Vth distributions of memory cells of different sub-blocks which have different erase speeds at the end of an erase operation, when a relatively small erase voltage duration and a relatively large number of erase loops are used.

FIG. 11F depicts a portion of the block of FIG. 9B and voltages used in an example erase operation.

FIG. 11G depicts an example erase operation consistent with the configuration of SGD transistors in FIG. 11F.

FIG. 12A depicts a table of example voltages used in an erase operation consistent with FIG. 9A.

FIG. 12B depicts a table of example voltages used in an erase operation consistent with FIG. 9B.

FIG. 12C depicts a table of example voltages used in an erase operation consistent with FIG. 9C.

FIG. 12D depicts another table of example voltages used in an erase operation consistent with FIG. 9C.

FIG. 13A depicts an example sequence of erase pulses in an erase operation.

FIG. 13B depicts an example sequence of control gate voltages for select gate transistors, consistent with FIGS. 12A and 13A.

FIG. 13C depicts an example of channel voltages consistent with FIGS. 13A and 13B.

FIG. 13D depicts an example sequence of word line voltages consistent with FIGS. 13A and 13B.

DETAILED DESCRIPTION

Figure 1:
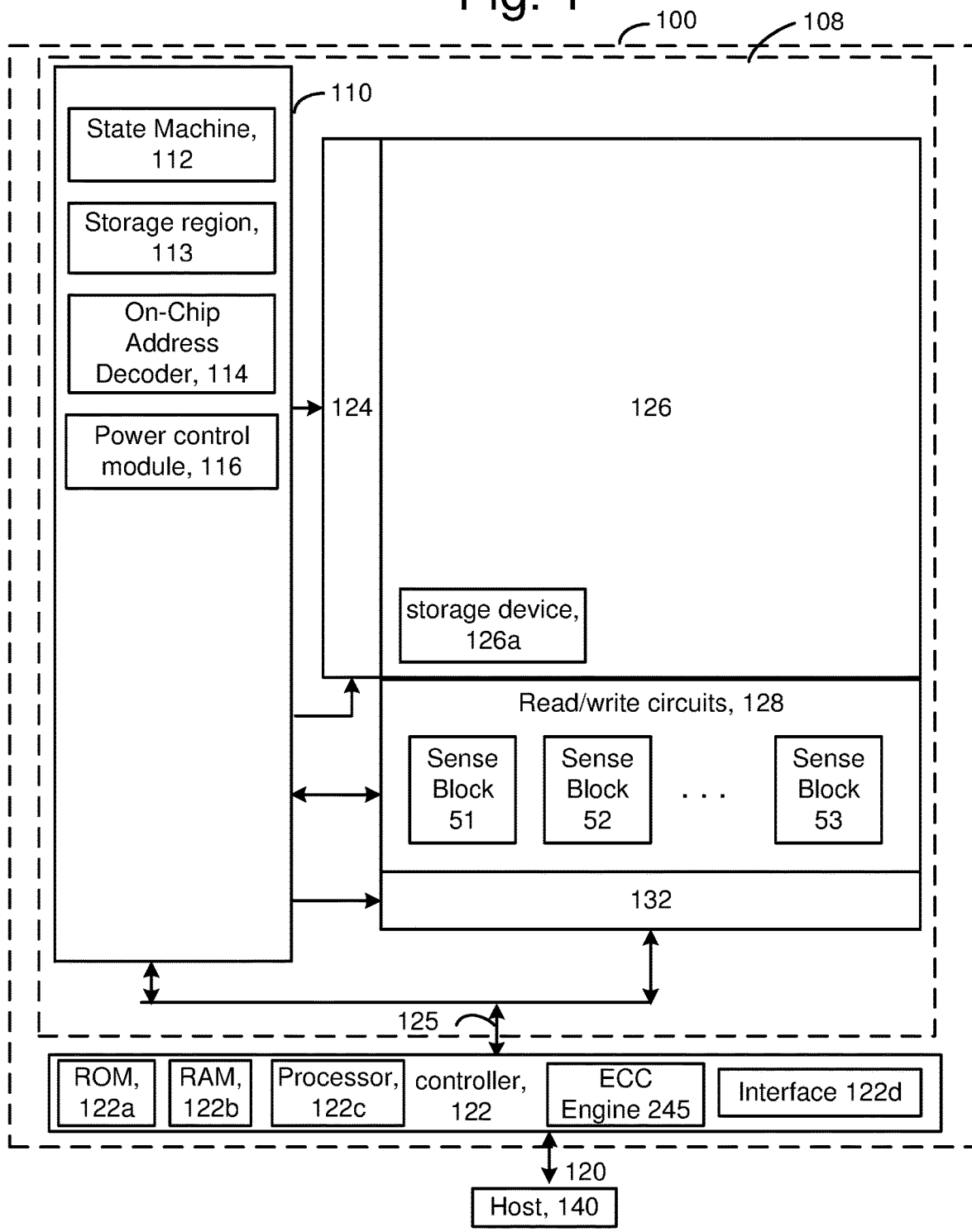
FIG. 1 is a block diagram of an example memory device.

Apparatuses and techniques are described for optimizing an erase operation in a memory device to compensate for erase speed variations due to factors such as blocking oxide layer thinning.

In some memory devices, memory cells are joined to one another such as in NAND strings in a block or sub-block. Each NAND string comprises a number of memory cells connected in series between one or more drain end select gate transistors (referred to as SGD transistors), on a drain end of the NAND string which is connected to a bit line, and one or more source end select gate transistors (referred to as SGS transistors), on a source end of the NAND string or other memory string or set of connected memory cells which is connected to a source line. Further, the memory cells can be arranged with a common control gate line (e.g., word line) which acts a control gate. A set of word lines extends from the source side of a block to the drain side of a block. Memory cells can be connected in other types of strings and in other ways as well.

In a 3D memory structure, the memory cells may be arranged in vertical NAND strings in a stack, where the stack comprises alternating conductive and dielectric layers. The conductive layers act as word lines which are connected to the memory cells. Each NAND string may have the shape of a pillar which intersects with the word lines to form the memory cells.

The memory cells can include data memory cells, which are eligible to store user data, and dummy or non-data memory cells which are ineligible to store user data. A dummy memory cell may have the same construction as a data memory cell but is considered by the controller to be ineligible to store any type of data including user data. A dummy word line is connected to a dummy memory cell. One or more dummy memory cells may be provided at the drain and/or source ends of a string of memory cells to provide a gradual transition in the channel voltage gradient.

In some 3D memory structures, the memory cells are arranged in vertical NAND strings (or other sets of connected memory cells) in a stack, where the stack comprises alternating conductive and dielectric layers. In this structure, the conductive layers act as word lines which are connected to the memory cells. Further, the memory cells may be formed by annular layers of blocking oxide, charge-trapping material, tunnel oxide and channel polysilicon which extend in the stack. The blocking oxide layer separates the charge trapping layer from the word line so that charges in the charge trapping layer are blocked from reaching the word line.

The layers may be arranged concentrically. Each NAND string may have the shape of a pillar which intersects with the word lines to form the memory cells.

Each memory cell may be associated with a data state according to write data in a program command Based on its data state, a memory cell will either remain in the erased state or be programmed to a programmed data state. For example, in a single bit per cell memory device, also referred to as SLC, or single level cell, there are two data states including the erased state and the programmed state. MLC or multi-level cells store two or more bits per cell, as a multiple bit memory cell. For example, in a two-bit per cell memory device, there are four data states including the erased state and three higher data states referred to as the A, B and C data states. In a three-bit per cell memory device, there are eight data states including the erased state and seven higher data states referred to as the A-G data states (see FIG. 10A). In a four-bit per cell memory device, there are sixteen data states including the erased state (S0) and fifteen higher data states, S0-S15.

A program operation may use a set of increasing program voltages or pulse which are applied to the word line in respective program loops or program-verify iterations in one or more program passes.

Verify tests may be performed after each program voltage to determine whether the memory cells have completed programming A verify test can involve applying a verify voltage of an assigned data state to the selected word line while sensing circuitry determines whether cells connected to the word line are in a conductive or non-conductive state. As in a read operation, the voltages of the unselected word lines are set to a read pass voltage which is high enough to place the unselected memory cells in a strongly conductive state, to avoid interfering with the sensing of the selected memory cells. If a memory cell is in a non-conductive state, the Vth of the memory cell exceeds the control gate voltage and the memory cell has reached the assigned data state. Programming is thus completed for the memory cell, and it can be locked out from further programming while programming continues for other memory cells in subsequent program loops.

After the memory cells are programmed, the data can be read back in a read operation. A read operation can involve applying a series of read voltages to a word line while sensing circuitry determines whether cells connected to the word line are in a conductive or non-conductive state. If a memory cell is in a non-conductive state, the Vth of the memory cell exceeds the read voltage. The read voltages are set at levels which are expected to be between the threshold voltage levels of adjacent data states. During the read operation, the voltages of the unselected word lines are set at a read pass voltage which is high enough to place the unselected memory cells in a strongly conductive state, to avoid interfering with the sensing of the selected memory cells.

An erase operation involves transitioning the memory cells from the programmed state to an erased state. During the erase operation, it is desired to lower the threshold voltage (Vth) of each memory cell below an erase-verify level which represents an erased data state. An erase operation can include a number of erase loops, where each loop comprises an erase portion follow by a verify portion. In the erase portion, voltages are applied to the block to provide a positive channel-to-gate voltage for the memory cells of the block to drive electrons out of the charge-storing material of the cells, thereby reducing the Vth of the memory cells. In the verify portion, a verify voltage is applied to the control gates of the memory cells via the word lines of the block, and sensing circuitry is used to sense currents in the NAND strings to determine if the memory cells have been sufficiently erased.

A positive channel-to-gate voltage is obtained by charging up (increasing a voltage of) the channels of the NAND strings by introducing holes (positive charges) into the channel One approach is to generate holes by gate-induced drain leakage (GIDL) at the SGD transistors of the NAND strings. GIDL can be generated in proportion to a drain-to-gate voltage of the SGD transistors, where the drain voltage is equal to the bit line voltage.

However, the erase speed can vary for memory cells of different NAND strings based on their distance from the edge of a block, where an etchant is introduced to remove the sacrificial material of the word lines before depositing the metal of the word lines during the fabrication of the block. See FIGS. 6C and 8A-8C, for instance. In particular, in addition to removing the sacrificial material, the etchant removes some of the blocking oxide layer 563, 563a, 563b and 563c of the memory cells. Moreover, the blocking oxide layers which are closest to the edge of the block receive the most etching and become the thinnest. Thus, the thickness Th (FIG. 8B) of the blocking oxide layers, which may comprise silicon dioxide (SiO2), varies for memory holes based on their distance from the closest edge of the block from which an etchant is introduced. See example edges 630 and 631 in FIG. 8A. A thinner blocking oxide layer results in a faster erase speed because the gate-to-channel distance decreases. With a given gate-to-channel voltage in the erase operation, the electric field strength is larger when the gate-to-channel distance is smaller.

Techniques provided herein address the above and other issues. In particular, an erase operation accounts for different erase speeds of different sub-blocks of a block based on the positions of the sub-blocks in a block and based on the corresponding blocking oxide layer thickness associated with the position. The amount of charging up of the channels of the NAND strings can be smaller for sub-blocks which have a relatively small blocking oxide layer thickness, to reduce their erase speed. In one approach, the amount of charging up of the channels of the NAND strings is reduced by reducing the drain-to-gate voltage of the SGD transistors. This can be achieved by increasing the control gate voltage of the SGD transistors.

Moreover, the techniques can be used with different configurations of SGD transistors. In one configuration, as in FIG. 9A, there are multiple SGD transistors in each NAND string and the SGD transistors all have their control gates connected within each sub-block so that they received a common voltage. In another configuration, as in FIG. 9B, a first SGD transistor is disconnected from other SGD transistors in each NAND string, and the first SGD transistors all have their control gates connected to one another in the different sub-blocks of a block. In another configuration, as in FIG. 9C, a first SGD transistor is disconnected from other SGD transistors in each NAND string, and the first SGD transistors have their control gates connected to one another within each sub-block but disconnected from one another in different sub-blocks. In another configuration, as in FIG. 9D, the first SGD transistors have their control gates connected to one another in sub-blocks which have a common blocking oxide layer thickness. Various other configurations are possible as well.

The techniques are generally applicable for equalizing the erase depth of different sub-blocks in a block, and of different rows of NAND strings in a sub-block.

These and other features are discussed further below.

FIG. 1 is a block diagram of an example memory device. The memory device 100, such as a non-volatile storage system, may include one or more memory die 108. The memory die 108 includes a memory structure 126 of memory cells, such as an array of memory cells, control circuitry 110, and read/write circuits 128. The memory structure 126 is addressable by word lines via a row decoder 124 and by bit lines via a column decoder 132. The read/write circuits 128 include multiple sense blocks 51, 52, . . . 53 (sensing circuitry) and allow a page of memory cells to be read or programmed in parallel. Typically a controller 122 is included in the same memory device 100 (e.g., a removable storage card) as the one or more memory die 108. The controller may be separate from the memory die. Commands and data are transferred between the host 140 and controller 122 via a data bus 120, and between the controller and the one or more memory die 108 via lines 125.

The memory structure can be 2D or 3D. The memory structure may comprise one or more array of memory cells including a 3D array. The memory structure may comprise a monolithic 3D memory structure in which multiple memory levels are formed above (and not in) a single substrate, such as a wafer, with no intervening substrates. The memory structure may comprise any type of non-volatile memory that is monolithically formed in one or more physical levels of arrays of memory cells having an active area disposed above a silicon substrate. The memory structure may be in a non-volatile memory device having circuitry associated with the operation of the memory cells, whether the associated circuitry is above or within the substrate.

The control circuitry 110 cooperates with the read/write circuits 128 to perform memory operations on the memory structure 126, and includes a state machine 112, an on-chip address decoder 114, and a power control module 116 (power control circuit). The state machine 112 provides chip-level control of memory operations. A storage region 113 may be provided, e.g., for operational parameters and software/code. In one embodiment, the state machine is programmable by the software. In other embodiments, the state machine does not use software and is completely implemented in hardware (e.g., electrical circuits).

The on-chip address decoder 114 provides an address interface between that used by the host or a memory controller to the hardware address used by the decoders 124 and 132. The power control module 116 controls the power and voltages supplied to the word lines, select gate lines, bit lines and source lines during memory operations. It can include drivers for word lines, SGS and SGD transistors and source lines. See also FIG. 3. The sense blocks can include bit line drivers, in one approach.

In some implementations, some of the components can be combined. In various designs, one or more of the components (alone or in combination), other than memory structure 126, can be thought of as at least one control circuit which is configured to perform the techniques described herein including the steps of the processes described herein. The control circuit is configured to program memory cells by applying one or more program pulses to a selected word line, and to apply program-inhibit and program-enable bit line voltages during the program pulses.

For example, a control circuit such as a programming circuit may include any one of, or a combination of, control circuitry 110, state machine 112, decoders 114 and 132, power control module 116, sense blocks 51, 52, . . . , 53, read/write circuits 128, controller 122, and so forth.

The off-chip controller 122 (which in one embodiment is an electrical circuit) may comprise a processor 122c, storage devices (memory) such as ROM 122a and RAM 122b and an error-correction code (ECC) engine 245. The ECC engine can correct a number of read errors.

The controller 122 or control circuitry 110 can be configured with hardware, firmware and/or software for implementing the techniques described herein.

A memory interface 122d may also be provided. The memory interface, in communication with ROM, RAM and processor, is an electrical circuit that provides an electrical interface between controller and memory die. For example, the memory interface can change the format or timing of signals, provide a buffer, isolate from surges, latch I/O and so forth. The processor can issue commands to the control circuitry 110 (or any other component of the memory die) via the memory interface 122d.

The storage device comprises code such as a set of instructions, and the processor is operable to execute the set of instructions to provide the functionality described herein. Alternatively or additionally, the processor can access code from a storage device 126a of the memory structure, such as a reserved area of memory cells in one or more word lines.

For example, code can be used by the controller to access the memory structure such as for programming, read and erase operations. The code can include boot code and control code (e.g., a set of instructions). The boot code is software that initializes the controller during a booting or startup process and enables the controller to access the memory structure. The code can be used by the controller to control one or more memory structures. Upon being powered up, the processor 122c fetches the boot code from the ROM 122a or storage device 126a for execution, and the boot code initializes the system components and loads the control code into the RAM 122b. Once the control code is loaded into the RAM, it is executed by the processor. The control code includes drivers to perform basic tasks such as controlling and allocating memory, prioritizing the processing of instructions, and controlling input and output ports.

Generally, the control code can include instructions to perform the functions described herein including the steps of the flowcharts discussed further below, and provide the voltage waveforms including those discussed further below. A control circuit can be configured to execute the instructions to perform the functions described herein.

In one embodiment, the host is a computing device (e.g., laptop, desktop, smartphone, tablet, digital camera) that includes one or more processors, one or more processor readable storage devices (RAM, ROM, flash memory, hard disk drive, solid state memory) that store processor readable code (e.g., software) for programming the one or more processors to perform the methods described herein. The host may also include additional system memory, one or more input/output interfaces and/or one or more input/output devices in communication with the one or more processors.

Other types of non-volatile memory in addition to NAND flash memory can also be used.

Semiconductor memory devices include volatile memory devices, such as dynamic random access memory ("DRAM") or static random access memory ("SRAM") devices, non-volatile memory devices, such as resistive random access memory ("ReRAM"), electrically erasable programmable read only memory ("EEPROM"), flash memory (which can also be considered a subset of EEPROM), ferroelectric random access memory ("FRAM"), and magnetoresistive random access memory ("MRAM"), and other semiconductor elements capable of storing information. Each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse or phase change material, and optionally a steering element, such as a diode or transistor. Further by way of non-limiting example, active semiconductor memory elements include EEPROM and flash memory device elements, which in some embodiments include elements containing a charge storage region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND string is an example of a set of series-connected transistors comprising memory cells and SG transistors.

A NAND memory array may be configured so that the array is composed of multiple strings of memory in which a string is composed of multiple memory elements sharing a single bit line and accessed as a group. Alternatively, memory elements may be configured so that each element is individually accessible, e.g., a NOR memory array. NAND and NOR memory configurations are examples, and memory elements may be otherwise configured.

The semiconductor memory elements located within and/or over a substrate may be arranged in two or three dimensions, such as a 2D memory structure or a 3D memory structure. In a 2D memory structure, the semiconductor memory elements are arranged in a single plane or a single memory device level. Typically, in a 2D memory structure, memory elements are arranged in a plane (e.g., in an x-y direction plane) which extends substantially parallel to a major surface of a substrate that supports the memory elements. The substrate may be a wafer over or in which the layer of the memory elements are formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

A 3D memory array is arranged so that memory elements occupy multiple planes or multiple memory device levels, thereby forming a structure in three dimensions (i.e., in the x, y and z directions, where the z direction is substantially perpendicular and the x and y directions are substantially parallel to the major surface of the substrate).

As a non-limiting example, a 3D memory structure may be vertically arranged as a stack of multiple 2D memory device levels. As another non-limiting example, a 3D memory array may be arranged as multiple vertical columns (e.g., columns extending substantially perpendicular to the major surface of the substrate, i.e., in the y direction) with each column having multiple memory elements. The columns may be arranged in a 2D configuration, e.g., in an x-y plane, resulting in a 3D arrangement of memory elements with elements on multiple vertically stacked memory planes. Other configurations of memory elements in three dimensions can also constitute a 3D memory array.

By way of non-limiting example, in a 3D NAND memory array, the memory elements may be coupled together to form a NAND string within a single horizontal (e.g., x-y) memory device level. Alternatively, the memory elements may be coupled together to form a vertical NAND string that traverses across multiple horizontal memory device levels. Other 3D configurations can be envisioned wherein some NAND strings contain memory elements in a single memory level while other strings contain memory elements which span through multiple memory levels. 3D memory arrays may also be designed in a NOR configuration and in a ReRAM configuration.

Typically, in a monolithic 3D memory array, one or more memory device levels are formed above a single substrate. Optionally, the monolithic 3D memory array may also have one or more memory layers at least partially within the single substrate. As a non-limiting example, the substrate may include a semiconductor such as silicon. In a monolithic 3D array, the layers constituting each memory device level of the array are typically formed on the layers of the underlying memory device levels of the array. However, layers of adjacent memory device levels of a monolithic 3D memory array may be shared or have intervening layers between memory device levels.

2D arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic 3D memory arrays. Further, multiple 2D memory arrays or 3D memory arrays (monolithic or non-monolithic) may be formed on separate chips and then packaged together to form a stacked-chip memory device.

Associated circuitry is typically required for operation of the memory elements and for communication with the memory elements. As non-limiting examples, memory devices may have circuitry used for controlling and driving memory elements to accomplish functions such as programming and reading. This associated circuitry may be on the same substrate as the memory elements and/or on a separate substrate. For example, a controller for memory read-write operations may be located on a separate controller chip and/or on the same substrate as the memory elements.

One of skill in the art will recognize that this technology is not limited to the 2D and 3D exemplary structures described but covers all relevant memory structures within the spirit and scope of the technology as described herein and as understood by one of skill in the art.

Figure 2:
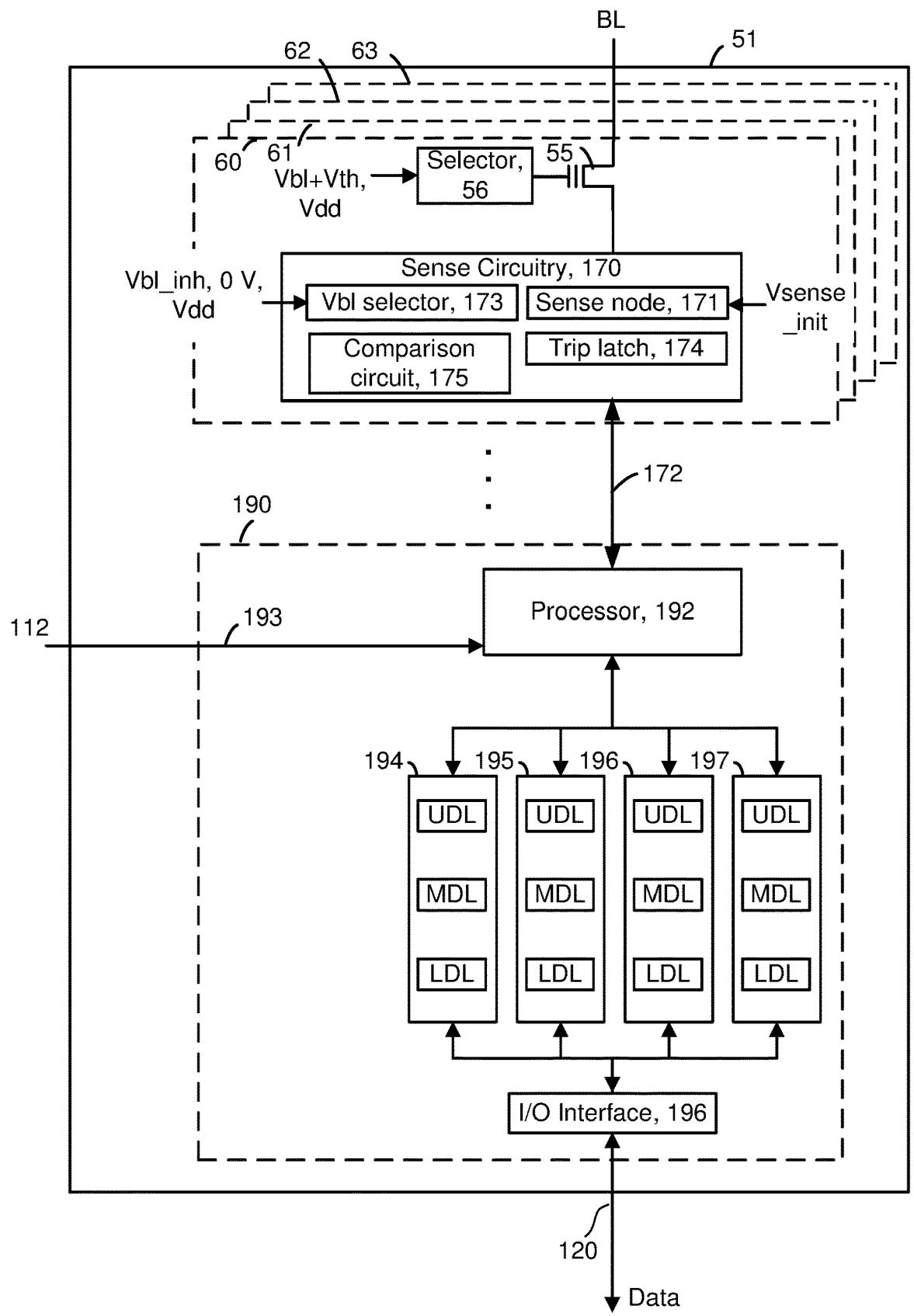
FIG. 2 is a block diagram depicting one embodiment of the sense block 51 of FIG. 1.

FIG. 2 is a block diagram depicting one embodiment of the sense block 51 of FIG. 1. An individual sense block 51 is partitioned into one or more core portions, referred to as sense circuits 60-63 or sense amplifiers, and a common portion, referred to as a managing circuit 190. In one embodiment, there will be a separate sense circuit for each bit line/NAND string and one common managing circuit 190 for a set of multiple, e.g., four or eight, sense circuits. Each of the sense circuits in a group communicates with the associated managing circuit via data bus 172. Thus, there are one or more managing circuits which communicate with the sense circuits of a set of storage elements (memory cells).

The sense circuit 60, as an example, comprises sense circuitry 170 that performs sensing by determining whether a conduction current in a connected bit line is above or below a predetermined threshold level. The sensing can occur in a read or verify operation. The sense circuit also supplies a bit line voltage during the application of a program voltage in a program operation.

The sense circuitry may include a Vbl selector 173, a sense node 171, a comparison circuit 175 and a trip latch 174. During the application of a program voltage, the Vbl selector 173 can pass a program-inhibit voltage Vbl_inh (e.g., 2 V) to a bit line connected to a memory cell which is inhibited from programmed, or a program-enable voltage, e.g., 0 V, to a bit line connected to a memory cell which is being programmed in the current program loop. A transistor 55 (e.g., an nMOS) can be configured as a pass gate to pass Vbl from the Vbl selector 173, by setting the control gate voltage of the transistor sufficiently high, e.g., higher than the Vbl passed from the Vbl selector. For example, a selector 56 may pass a power supply voltage Vdd, e.g., 3-4 V to the control gate of the transistor 55.

During sensing operations such as read and verify operations, the bit line voltage is set by the transistor 55 based on the voltage passed by the selector 56. The bit line voltage is roughly equal to the control gate voltage of the transistor minus its Vth (e.g., 1 V). For example, if Vbl+Vth is passed by the selector 56, the bit line voltage will be Vbl. This assumes the source line is at 0 V. The transistor 55 clamps the bit line voltage according to the control gate voltage and acts a source-follower rather than a pass gate. The Vbl selector 173 may pass a relatively high voltage such as Vdd which is higher than the control gate voltage on the transistor 55 to provide the source-follower mode. During sensing, the transistor 55 thus charges up the bit line.

In one approach, the selector 56 of each sense circuit can be controlled separately from the selectors of other sense circuits, to pass Vbl or Vdd. The Vbl selector 173 of each sense circuit can also be controlled separately from the Vbl selectors of other sense circuits.

During sensing, the sense node 171 is charged up to an initial voltage such as Vsense_init=3 V. The sense node is then connected to the bit line via the transistor 55, and an amount of decay of the sense node is used to determine whether a memory cell is in a conductive or non-conductive state. The comparison circuit 175 is used to compare the sense node voltage to a trip voltage at a sense time. For example, in a program operation, if the sense node voltage decays below the trip voltage Vtrip, the memory cell is in a conductive state and its Vth is at or below the program-verify voltage and has not completed being programmed (the program-verify test is not passed). If the sense node voltage does not decay below Vtrip, the memory cell is in a non-conductive state and its Vth is above the program-verify voltage and has completed being programmed (the program-verify test is passed). The sense circuit 60 includes a trip latch 174 that is set by the comparison circuit 175 based on whether the memory cell is in a conductive or non-conductive state. The data in the trip latch can be a bit which is read out by the processor 192.

During an erase-verify test of an erase operation, an amount of decay of the sense node is used to determine whether a NAND strings is in a conductive or non-conductive state. If the sense node voltage decays below the trip voltage Vtrip, the NAND string is in a conductive state and its Vth is at or below the erase-verify voltage and has completed being erased, e.g., the erase-verify test is passed. If all, or nearly all of the NAND strings in a sub-block have completed being erased, the sub-block is also considered to have completed being erased and is inhibited from being further erased in a subsequent erase loop of the erase operation.

If the sense node voltage does not decay below Vtrip, the NAND string is in a non-conductive state and its Vth is above the erase-verify voltage and has not completed being erased, e.g., the erase-verify test is not passed. If a significant number of the NAND strings in a sub-block have not completed being erased, such as more than 1-5% of the NAND strings, the sub-block is also considered to not have completed being erased and is further erased in a subsequent erase loop of the erase operation. The erase-verify tests may be performed during the verify pulses VP1-VP3 of FIG. 13D.

The managing circuit 190 comprises a processor 192, four example sets of data latches 194-197 and an I/O Interface 196 coupled between the set of data latches 194 and data bus 120. One set of data latches, e.g., comprising individual latches LDL, MDL and UDL, can be provided for each sense circuit. In some cases, additional data latches may be used. LDL stores a bit for a lower page of data, MDL stores a bit for a lower page of data, and UDL stores a bit for an upper page of data. This is in an eight-level or three-bits per memory cell memory device.

The processor 192 performs computations, such as to determine the data stored in the sensed memory cell and store the determined data in the set of data latches. Each set of data latches 194-197 is used to store data bits determined by processor 192 during a read operation, and to store data bits imported from the data bus 120 during a program operation which represent write data meant to be programmed into the memory. I/O interface 196 provides an interface between data latches 194-197 and the data bus 120.

During reading, the operation of the system is under the control of state machine 112 that controls the supply of different control gate voltages to the addressed memory cell. As it steps through the various predefined control gate voltages corresponding to the various memory states supported by the memory, the sense circuit may trip at one of these voltages and a corresponding output will be provided from sense circuit to processor 192 via the data bus 172. At that point, processor 192 determines the resultant memory state by consideration of the tripping event(s) of the sense circuit and the information about the applied control gate voltage from the state machine via input lines 193. It then computes a binary encoding for the memory state and stores the resultant data bits into data latches 194-197.

Some implementations can include multiple processors 192. In one embodiment, each processor 192 will include an output line (not depicted) such that each of the output lines is wired-OR'd together. In some embodiments, the output lines are inverted prior to being connected to the wired-OR line. This configuration enables a quick determination during a program verify test of when the programming process has completed because the state machine receiving the wired-OR can determine when all bits being programmed have reached the desired level. For example, when each bit has reached its desired level, a logic zero for that bit will be sent to the wired-OR line (or a data one is inverted). When all bits output a data 0 (or a data one inverted), then the state machine knows to terminate the programming process. Because each processor communicates with eight sense circuits, the state machine needs to read the wired-OR line eight times, or logic is added to processor 192 to accumulate the results of the associated bit lines such that the state machine need only read the wired-OR line one time. Similarly, by choosing the logic levels correctly, the global state machine can detect when the first bit changes its state and change the algorithms accordingly.

During program or verify operations for memory cells, the data to be programmed (write data) is stored in the set of data latches 194-197 from the data bus 120, in the LDL, MDL and UDL latches, in a three-bit per memory cells implementation.

The program operation, under the control of the state machine, applies a set of programming voltage pulses to the control gates of the addressed memory cells. Each voltage pulse may be stepped up in magnitude from a previous program pulse by a step size in a processed referred to as incremental step pulse programming Each program voltage is followed by a verify operation to determine if the memory cells has been programmed to the desired memory state. In some cases, processor 192 monitors the read back memory state relative to the desired memory state. When the two are in agreement, the processor 192 sets the bit line in a program inhibit mode such as by updating its latches. This inhibits the memory cell coupled to the bit line from further programming even if additional program pulses are applied to its control gate.

Each set of data latches 194-197 may be implemented as a stack of data latches for each sense circuit. In one embodiment, there are three data latches per sense circuit 60. In some implementations, the data latches are implemented as a shift register so that the parallel data stored therein is converted to serial data for data bus 120, and vice versa. All the data latches corresponding to the read/write block of memory cells can be linked together to form a block shift register so that a block of data can be input or output by serial transfer. In particular, the bank of read/write circuits is adapted so that each of its set of data latches will shift data in to or out of the data bus in sequence as if they are part of a shift register for the entire read/write block.

The data latches identify when an associated memory cell has reached certain mileposts in a program operations. For example, latches may identify that a memory cell's Vth is below a particular verify voltage. The data latches indicate whether a memory cell currently stores one or more bits from a page of data. For example, the LDL latches can be used to store a lower page of data. An LDL latch is flipped (e.g., from 0 to 1) when a lower page bit is stored in an associated memory cell. An MDL or UDL latch is flipped when a middle or upper page bit, respectively, is stored in an associated memory cell. This occurs when an associated memory cell completes programming.

Figure 3:
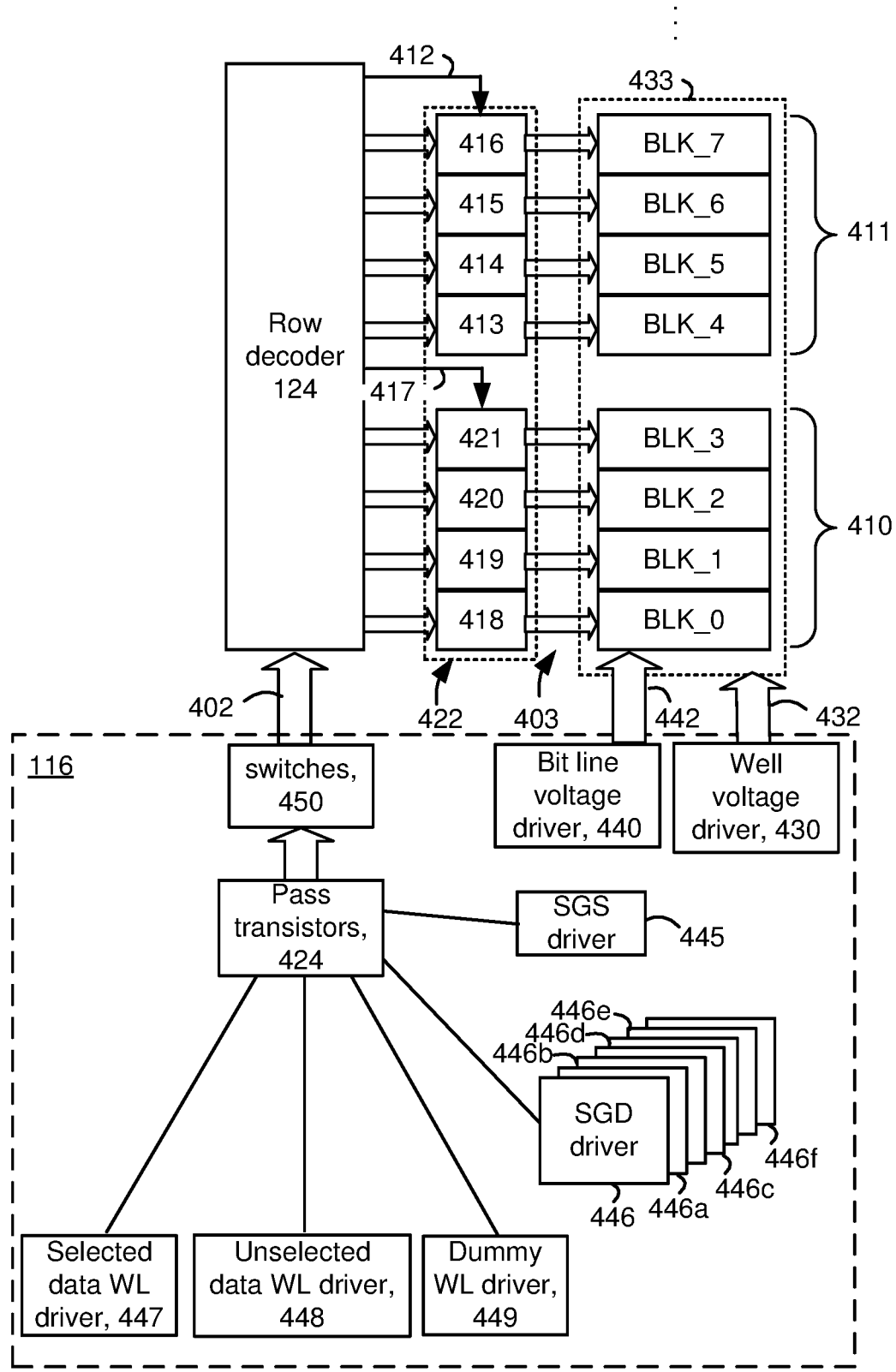
FIG. 3 depicts an example implementation of the power control module 116 of FIG. 1 for providing voltages to blocks of memory cells.

FIG. 3 depicts an example implementation of the power control module 116 of FIG. 1 for providing voltages to blocks of memory cells. In this example, the memory structure 126 includes a set 410 of four related blocks, BLK_0 to BLK_3, and another set 411 of four related blocks, BLK_4 to BLK_7. The blocks can be in one or more planes. The row decoder 124 of FIG. 1 provides voltages to word lines and select gates of each block via pass transistors 422. The row decoder provides a control signal to pass transistors which connect the blocks to the row decoder. In one approach, the pass transistors of each set of blocks are controlled by a common control gate voltage. Thus, the pass transistors for a set of block are either all on or off at a given time. If the pass transistors are on (conductive), a voltage from the row decoder is provided to the respective control gate lines or word lines. If the pass transistors are off (non-conductive), the row decoder is disconnected from the respective control gate lines or word lines so that the voltage floats on the respective control gate lines or word lines.

For instance, a control gate line 412 is connected to sets of pass transistors 413, 414, 415 and 416, which in turn are connected to control gate lines of BLK_4, BLK_5, BLK_6 and BLK_7, respectively. A control gate line 417 is connected to sets of pass transistors 418, 419, 420 and 421, which in turn are connected to control gate lines of BLK_0, BLK_1, BLK_2 and BLK_3, respectively.

Typically, program or read operations are performed on one selected block at a time and on one selected sub-block of the block. An erase operation is typically performed initially on an entire block. The row decoder can connect global control lines 402 to local control lines 403. The control lines represent conductive paths. Voltages are provided on the global control lines from a number of voltage drivers. Some of the voltage drivers may provide voltages to switches 450 which connect to the global control lines. Pass transistors 424 are controlled to pass voltages from the voltage drivers to the switches 450.

Figure 5A:
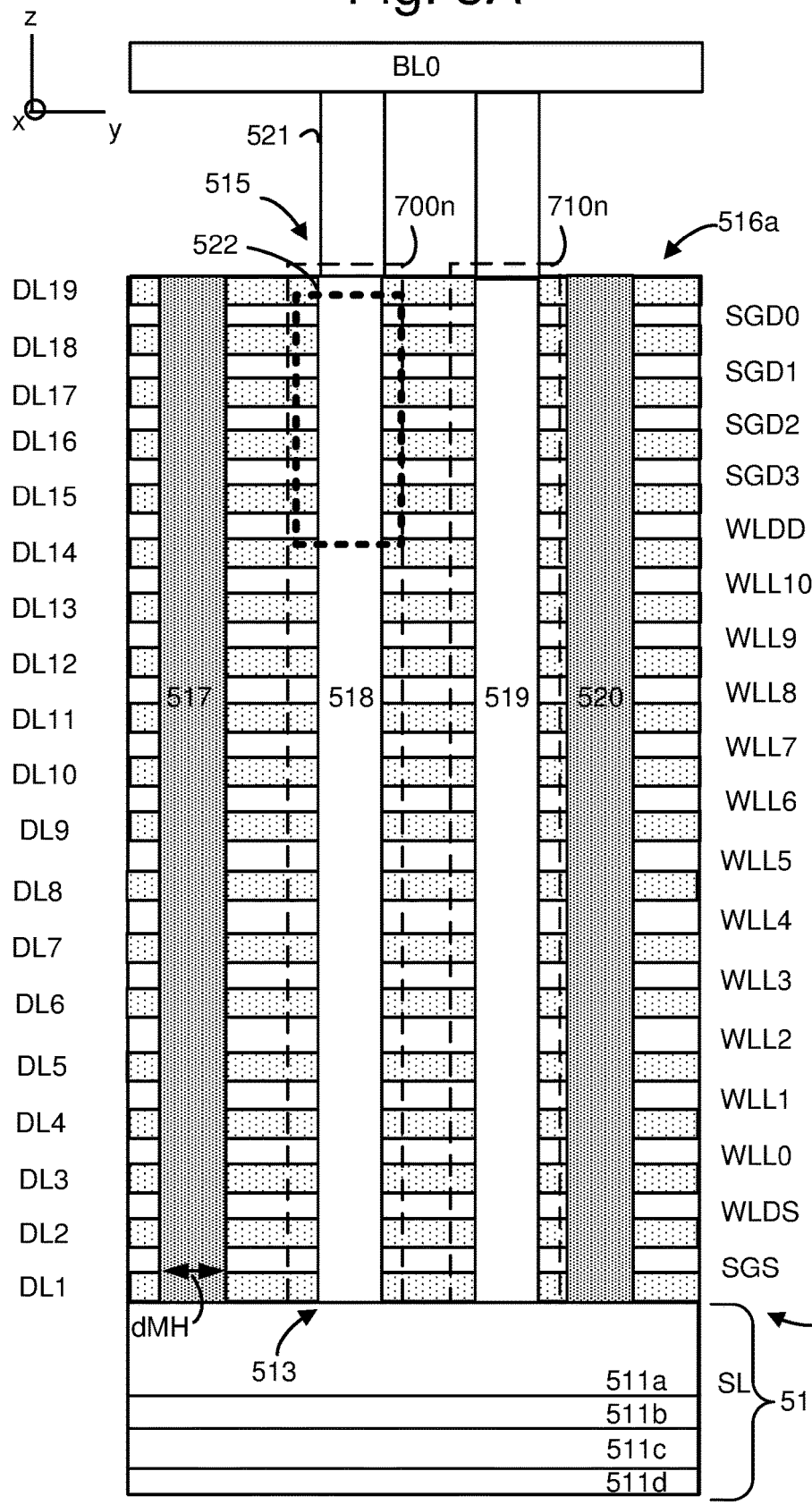
FIG. 5A depicts an example cross-sectional view of a portion of the block BLK0 of FIG. 4.

The voltage drivers can include a selected data word line (WL) driver 447, which provides a voltage on a data word line selected during a program or read operation, a driver 448 for unselected data word lines, and a driver for dummy word lines 449 (e.g., WLDD0, WLDD1, WLDS1 and WLDS0, respectively, in FIG. 5A).

Figure 9A:
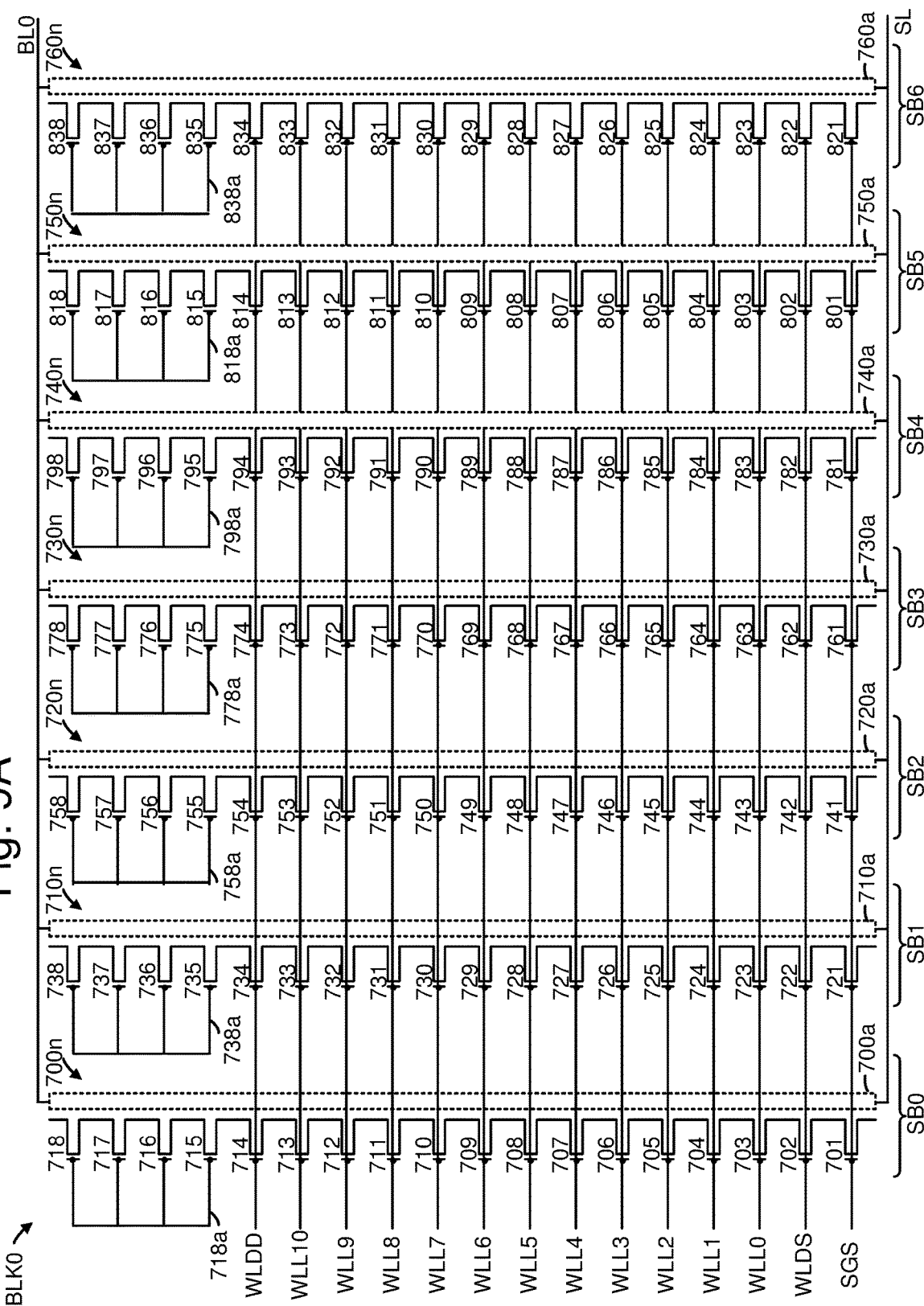
FIG. 9A depicts a first example configuration of select gate transistors in the block BLK0 of FIG. 7B.

The voltage drivers can also include an SGS driver 445 for a block, and separate SGD drivers 446-446f for sub-blocks SB0-SB6, respectively, such as in FIG. 9A. For example, the SGD transistors 715-718 in SB0 can be driven by one SGD driver, the SGD transistors 735-738 in SB1 can be driven by another SGD driver, and so forth.

In another example, there is one SGD driver shared by each sub-block, and another SGD driver specific to each sub-block. For example, in FIG. 9B, the SGD transistors 715-717 in SB0 can be driven by one SGD driver, the SGD transistors 735-737 in SB1 can be driven by another SGD driver, and so forth. Also, the topmost SGD transistors 718, 738, 758, 778, 798, 818 and 838 in SB0-SB6, respectively, would be driven by another SGD driver.

In another example, there are two SGD drivers for each sub-block. For example, in FIG. 9C, in SB0, the SGD transistors 715-717 can be driven by one SGD driver, and the SGD transistor 718 can be driven by another SGD driver.

In another example, such there is one SGD driver for the SGD transistors which are not connected in different sub-blocks and another SGD driver for each pair of sub-blocks in which SGD transistors are connected. For example, in FIG. 9D, the SGD transistors 715-717 in SB0 can be driven by one SGD driver, the SGD transistors 835-837 in SB6 can be driven by another SGD driver, and the connected SGD transistors 718 and 838 can be driven by another SGD driver.

In some cases, there can be multiple SGD transistors, multiple SGS transistors, multiple drain side dummy memory cells and/or multiple source side dummy memory cells in each NAND string. To provide the greatest flexibility in programming these memory cells and transistors with program voltages or other word line specific parameters, there can be a separate driver for each select gate transistor and dummy memory cell in a NAND string, in one approach.

The various components, including the row decoder, may receive commands from a controller such as the state machine 112 or the controller 122 to perform the functions described herein.

In one approach, the well region 433 is common to the blocks and may be driven by a voltage driver 430 via a path 432. A set of bit lines 442 is also shared by the blocks. A bit line voltage driver 440 provides voltages to the bit lines. In a stacked memory device such as depicted in FIGS. 4 to 7B, sets of connected memory cells may be arranged in NAND strings which extend vertically upward from the substrate. The bottom (or source end) of each NAND string is in contact with the well region, and the top end (or drain end) of each NAND string is connected to a respective bit line, in one approach.

Figure 4:
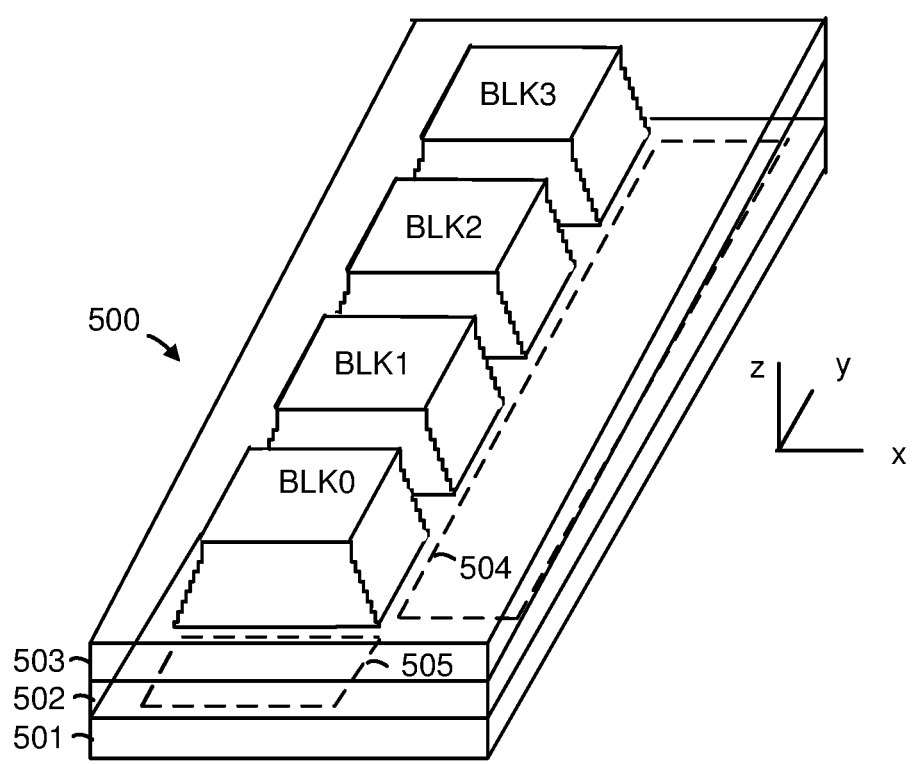
FIG. 4 is a perspective view of a memory device 500 comprising a set of blocks in an example 3D configuration of the memory structure 126 of FIG. 1.

FIG. 4 is a perspective view of a memory device 500 comprising a set of blocks in an example 3D configuration of the memory structure 126 of FIG. 1. On the substrate 501 are example blocks BLK0, BLK1, BLK2 and BLK3 of memory cells and peripheral areas with circuitry for use by the blocks. The peripheral area 504 runs along an edge of each block while the peripheral area 505 is at an end of the set of blocks. The circuitry can include voltage drivers which can be connected to control gate layers, bit lines and source lines of the blocks. In one approach, control gate layers at a common height in the blocks are commonly driven. The substrate 501 can also carry circuitry under the blocks, and one or more lower metal layers which are patterned in conductive paths to carry signals of the circuitry. The blocks are formed in an intermediate region 502 of the memory device. In an upper region 503 of the memory device, one or more upper metal layers are patterned in conductive paths to carry signals of the circuitry. Each block comprises a stacked area of memory cells, where alternating levels of the stack represent word lines. In one possible approach, each block has opposing tiered sides from which vertical contacts extend upward to an upper metal layer to form connections to conductive paths. While four blocks are depicted as an example, two or more blocks can be used, extending in the x- and/or y-directions.

In one possible approach, the blocks are in a plane, and the length of the plane, in the x-direction, represents a direction in which signal paths to word lines extend in the one or more upper metal layers (a word line or SGD line direction), and the width of the plane, in the y-direction, represents a direction in which signal paths to bit lines extend in the one or more upper metal layers (a bit line direction). The z-direction represents a height of the memory device. The blocks could also be arranged in multiple planes.

FIG. 5A depicts an example cross-sectional view of a portion of the block BLK0 of FIG. 4. The block comprises a stack 516 of alternating conductive layers (e.g., word lines or control gate lines) and dielectric layers. In this example, the conductive layers comprise first through four SGD layers, SGD0-SGD3, respectively. The conductive layers also include one SGS layer, one source side dummy word line layer WLDS, one drain side dummy word line layer WLDD, and eleven data word line layers (or data word lines) WLL0-WLL10. WLL0 is a source side data word line and WLL10 is a drain side data word line. The dielectric layers are labelled as DL1-DL19. Further, regions of the stack which comprise NAND strings 700n and 710n are depicted. Each NAND string encompasses a memory hole 518 or 519 which is filled with materials which form memory cells adjacent to the word lines. Region 522 of the stack is shown in greater detail in FIG. 6.

The stack includes a substrate 511. In one approach, a portion of the source line SL comprises a well region 511a as an n-type source diffusion layer or well in the substrate. The well region is in contact with a source end of each string of memory cells in a block. An erase pulse may be applied to this layer in an erase operation The n-type well region 511a is formed in a p-type well region 511b, which in turn is formed in an n-type well region 511c, which in turn is formed in a p-type semiconductor substrate 511d, in one possible implementation. The n-type source diffusion layer may be shared by all of the blocks in a plane, in one approach.

NAND string 700n has a source-end 513 at a bottom 516b of the stack 516 and a drain-end 515 at a top 516a of the stack. Metal-filled slits 517 and 520 may be provided periodically across the stack as interconnects which extend through the stack, such as to connect the source line to a line above the stack. The slits may be used during the formation of the word lines and subsequently filled with metal. A portion of a bit line BL0 is also depicted. A conductive via 521 connects the drain-end 515 to BL0.

In one approach, the block of memory cells comprises a stack of alternating control gate and dielectric layers, and the memory cells are arranged in vertically extending memory holes in the stack.

In one approach, each block comprises a terraced edge in which vertical interconnects connect to each layer, including the SGS, WL and SGD layers, and extend upward to horizontal paths to voltage drivers.

A memory hole diameter, dMH, is also depicted. See FIG. 5C for further details.

Figure 5B:
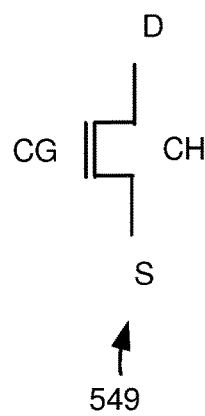
FIG. 5B depicts an example transistor 549 in BLK0 of FIG. 4.

FIG. 5B depicts an example transistor 549 in BLK0 in FIG. 4. The transistor comprises a control gate CG, a drain D, a source S and a channel CH and may represent a memory cell or a select gate transistor, for example.

Figure 5C:
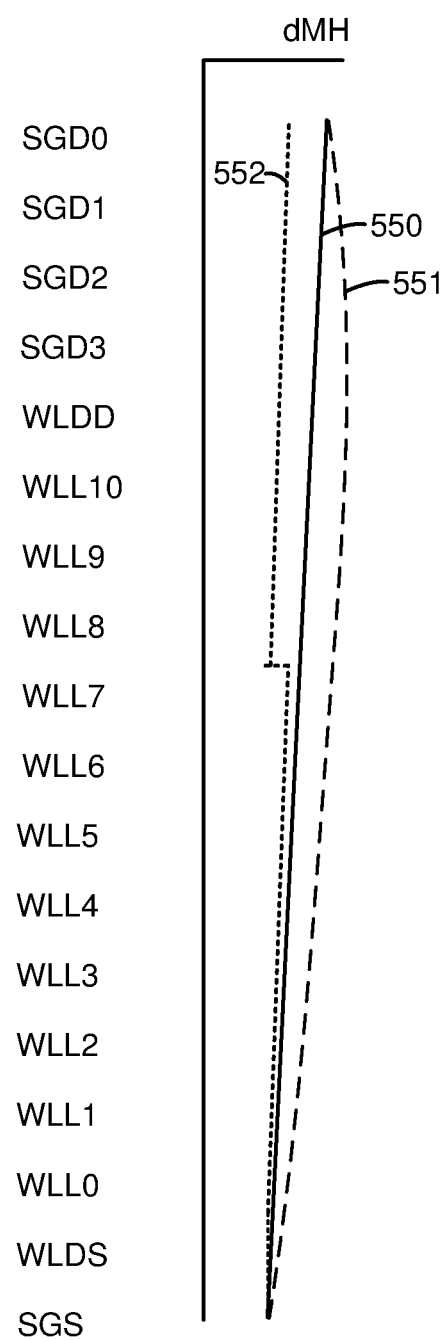
FIG. 5C depicts a plot of memory hole diameter in the stack of FIG. 5A.

FIG. 5C depicts a plot of memory hole diameter in the stack of FIG. 5A. The vertical axis depicts a diameter dMH of the memory holes and the pillars formed by materials in the memory holes. In such a memory device, the memory holes which are etched through the stack have a very high aspect ratio. For example, a depth-to-diameter ratio of about 25-30 is common. The memory holes may have a circular cross-section. Due to the etching process, the memory hole and resulting pillar width can vary along the length of the hole. Typically, the diameter becomes progressively smaller from the top to the bottom of the memory hole (plot 550). That is, the memory holes are tapered, narrowing at the bottom of the stack. In some cases, a slight narrowing occurs at the top of the hole near the select gate so that the diameter becomes slight wider before becoming progressively smaller from the top to the bottom of the memory hole (plot 551).

Due to the non-uniformity in the diameter of the memory hole and pillar, the programming and erase speed of the memory cells can vary based on their position along the memory hole. With a relatively smaller diameter portion of a memory hole, the electric field across the tunnel oxide is relatively stronger, so that the programming and erase speed is higher. This variation is in addition to the variation caused by different thicknesses of the blocking oxide layer.

In another possible implementation, represented by plot 552, the stack is fabricated in two tiers. The stack can be fabricated in two or more tiers. The bottom tier is formed first with a respective memory hole. The top tier is then formed with a respective memory hole which is aligned with the memory hole in the bottom tier. Each memory hole is tapered such that a double tapered memory hole is formed in which the width increases, then decreases and increases again, moving from the bottom of the stack to the top.

FIG. 6 depicts a close-up view of the region 522 of the stack of FIG. 5A. Select gate transistors and memory cells are formed at the different levels of the stack at the intersection of a word line layer and a memory hole. In this example, SGD transistors 715-718 are formed above a dummy memory cell 714 at the drain end of the NAND string.

A number of layers can be deposited along the sidewall (SW) of the memory hole 530 and/or within each word line layer, e.g., using atomic layer deposition. For example, each pillar 585 or column which is formed by the materials within a memory hole can include a blocking oxide layer 563 (e.g., comprising $SiO_2$), a charge-trapping layer 564 or film (e.g., comprising silicon nitride, $Si_3N_4$, or other nitride), a tunneling layer 565 (e.g., comprising a gate oxide), a channel 560 (e.g., comprising polysilicon), and a dielectric core 566 (e.g., comprising $SiO_2$). A word line layer can include a metal barrier 561 and a conductive metal 562 such as Tungsten as a control gate. For example, control gates 590-594 are provided. In this example, all of the layers except the metal are provided in the memory hole. In other approaches, some of the layers can be in the control gate layer. Additional pillars are similarly formed in the different memory holes. A pillar can form a columnar active area (AA) of a NAND string.

Each NAND string or set of connected transistors comprises a channel which extends continuously from one or more source-end select gate transistors to one or more drain-end select gate transistors. For example, in FIG. 9A to 9D, channels 700a, 710a, 720a, 730a, 740a, 750a and 760a extend continuously in NAND strings 700n, 710n, 720n, 730n, 740n, 750n and 760n, respectively, in SB0-SB6, respectively. The channels are continuous in that they are uninterrupted and can therefore provide a continuous conductive path in the NAND string.

When a memory cell is programmed, electrons are stored in a portion of the charge-trapping layer which is associated with the memory cell. These electrons are drawn into the charge-trapping layer from the channel, and through the tunneling layer. The Vth of a memory cell is increased in proportion to the amount of stored charge.

During an erase operation, the electrons return to the channel. Also during an erase operation, the channel of a NAND string may be charged, e.g., its voltage increased, by generating holes in the channel In one approach, the topmost or first SGD transistor is used to generate electron-hole pairs using GIDL. The electrons 595 move upward in the channel in the direction of the positive erase voltage at the bit line and the drain end of the NAND string, while the holes 596 move downward in the channel toward the source end of the NAND string. The holes become distributed in the channel adjacent to the memory cells so that a high positive channel-to-gate voltage can be obtained to erase the memory cells.

Each of the memory holes can be filled with a plurality of annular layers comprising a blocking oxide layer, a charge trapping layer, a tunneling layer and a channel layer. A core region of each of the memory holes is filled with a body material, and the plurality of annular layers are between the core region and the word line in each of the memory holes.

The NAND string can be considered to have a floating body channel because the length of the channel is not formed on a substrate. Further, the NAND string is provided by a plurality of word line layers above one another in a stack, and separated from one another by dielectric layers.

Figure 8A:
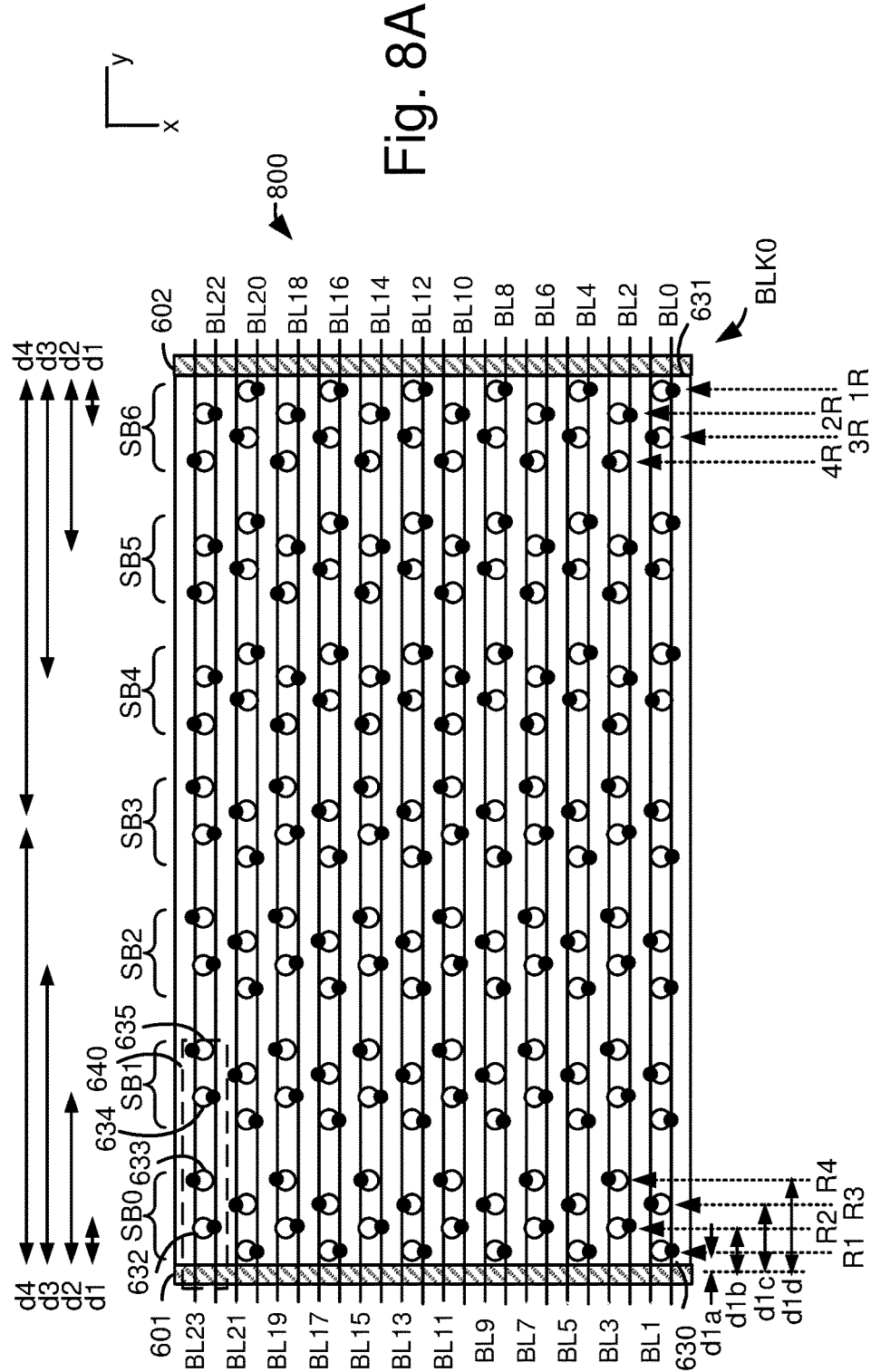
FIG. 8A depicts a top view of the example block BLK0 of FIG. 7B, where each sub-block comprise four rows of NAND strings.
Figure 8B:
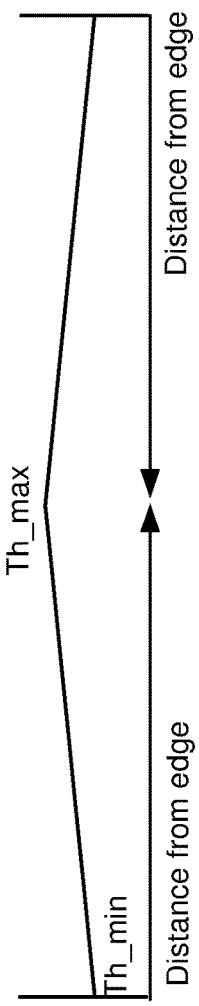
FIG. 8B depicts a plot showing a varying thickness of a blocking oxide layer in the block of FIG. 8A as a function of a distance from a nearest edge of the block.
Figure 8C:
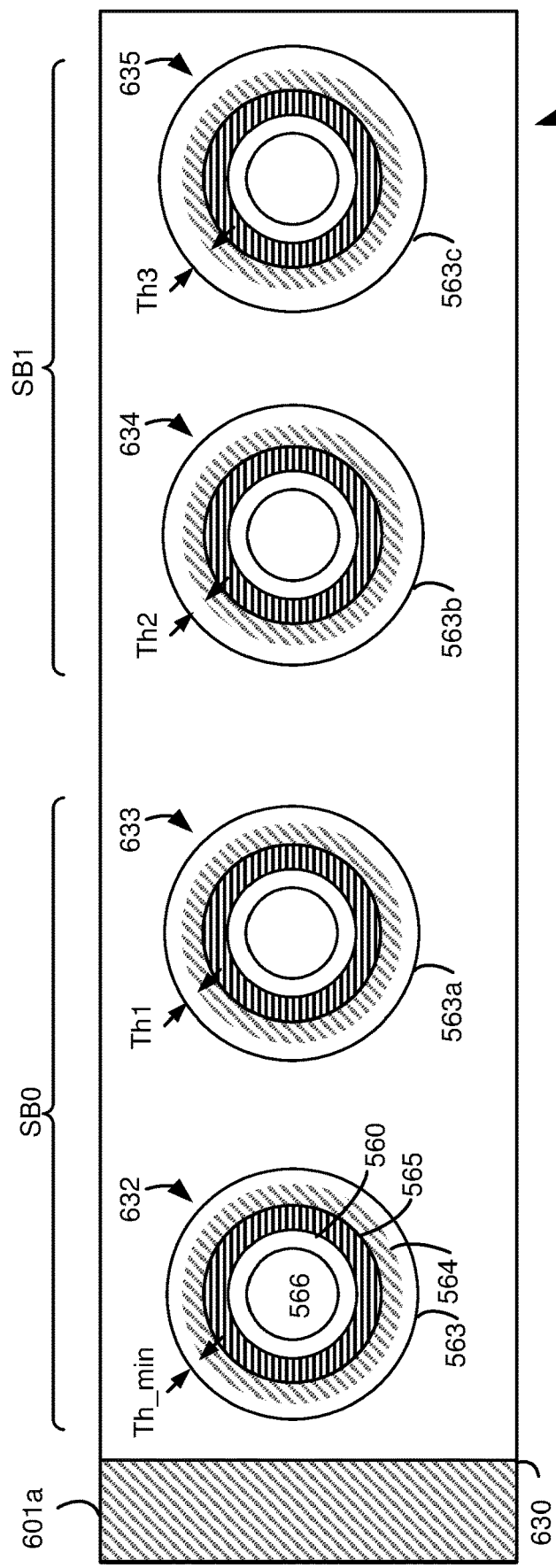
FIG. 8C depicts the region 640 of FIG. 8A in further detail, showing the varying thickness of a blocking oxide layer.

As mentioned, the thickness of the blocking oxide layer can vary across a block, in different sub-blocks and in different rows of a sub-block, as described further, e.g., in connection with FIGS. 8B and 8C.

Figure 7A:
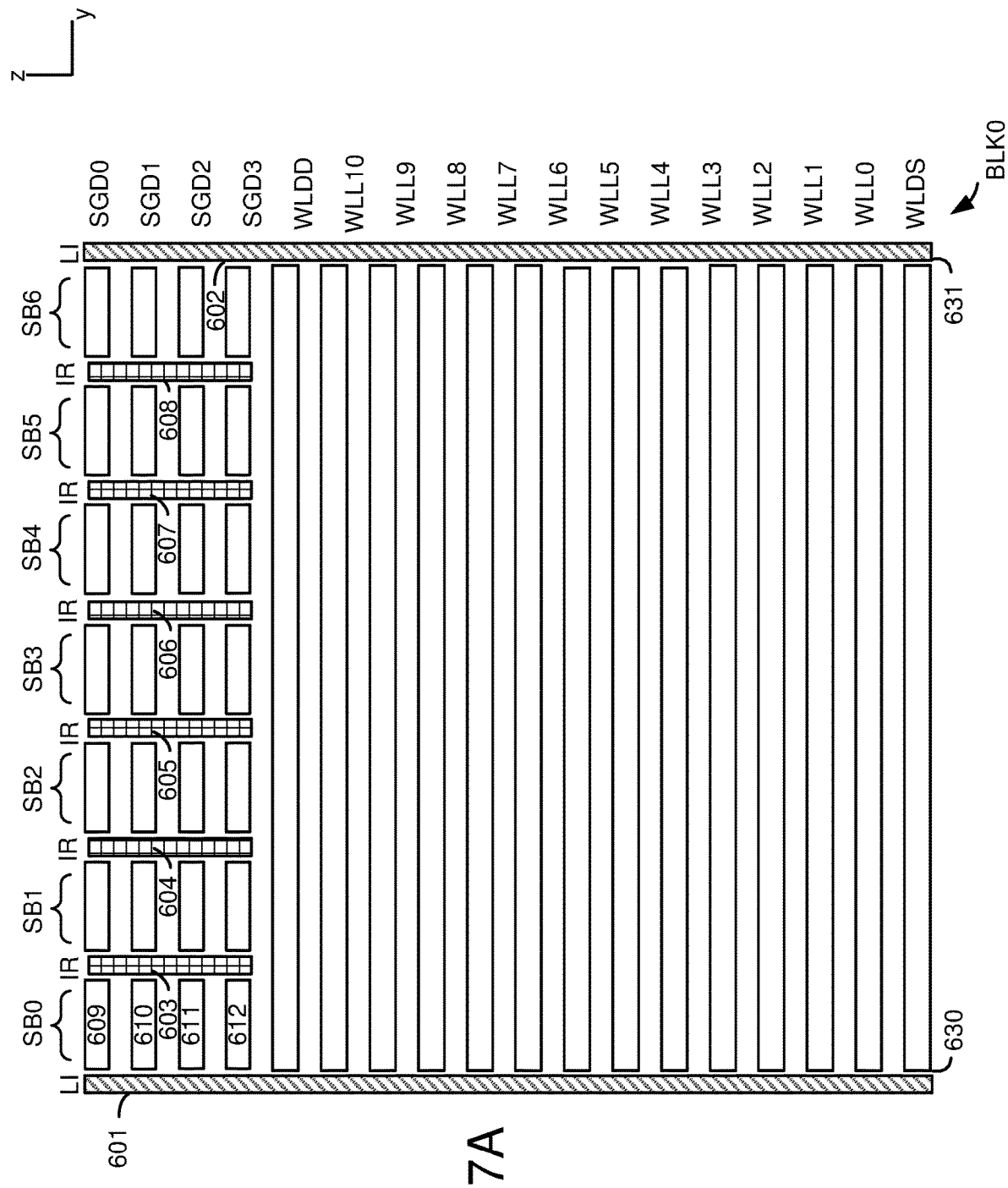
FIG. 7A depicts a side view of the block BLK0 of FIG. 4 in an example in which the block has seven sub-blocks.

FIG. 7A depicts a side view of the block BLK0 of FIG. 4 in an example in which the block has seven sub-blocks, SB0-SB6. This is an example of an odd number of sub-blocks in a block so that there is a single central sub-block, SB3. In another option, a block has an even number of sub-blocks and there are two central sub-blocks. The block comprises a plurality of word lines layers or control gate layers spaced apart vertically in a stack between local interconnects (LI) 601 and 602. Each sub-block has one or more separate SGD layers or conductive plates. In this example, each sub-block has four SGD layers, consistent with FIG. 5A. For example, SB0 has first through fourth SGD layers 609-612, respectively. The SGD layers of the different sub-blocks are separated by isolation regions (IR) 603-608 in this example. In some cases, the SGD layers within a sub-block can be connected to one another, such as in FIG. 9A-9D, so that SGD transistors have a common control gate voltage. In some cases, the SGD layers in different sub-blocks can be connected to one another, such as in FIGS. 9B and 9D. The layers can be connected by conductive paths in the block, or outside the block.

The block also comprises a plurality of word lines layers spaced apart vertically between the local interconnects. The local interconnects are adjacent to opposing edges 630 and 631 of the block at which an etchant is introduced in the fabrication process. In one approach, a local interconnect comprises metal surrounded by an insulation to provide an insulated conductive path from the top of the stack to the substrate. In another approach, a local interconnect is replaced by an isolation region (e.g., insulation such as oxide with no metal) which does not provide a conductive path through the stack.

Figure 7B:
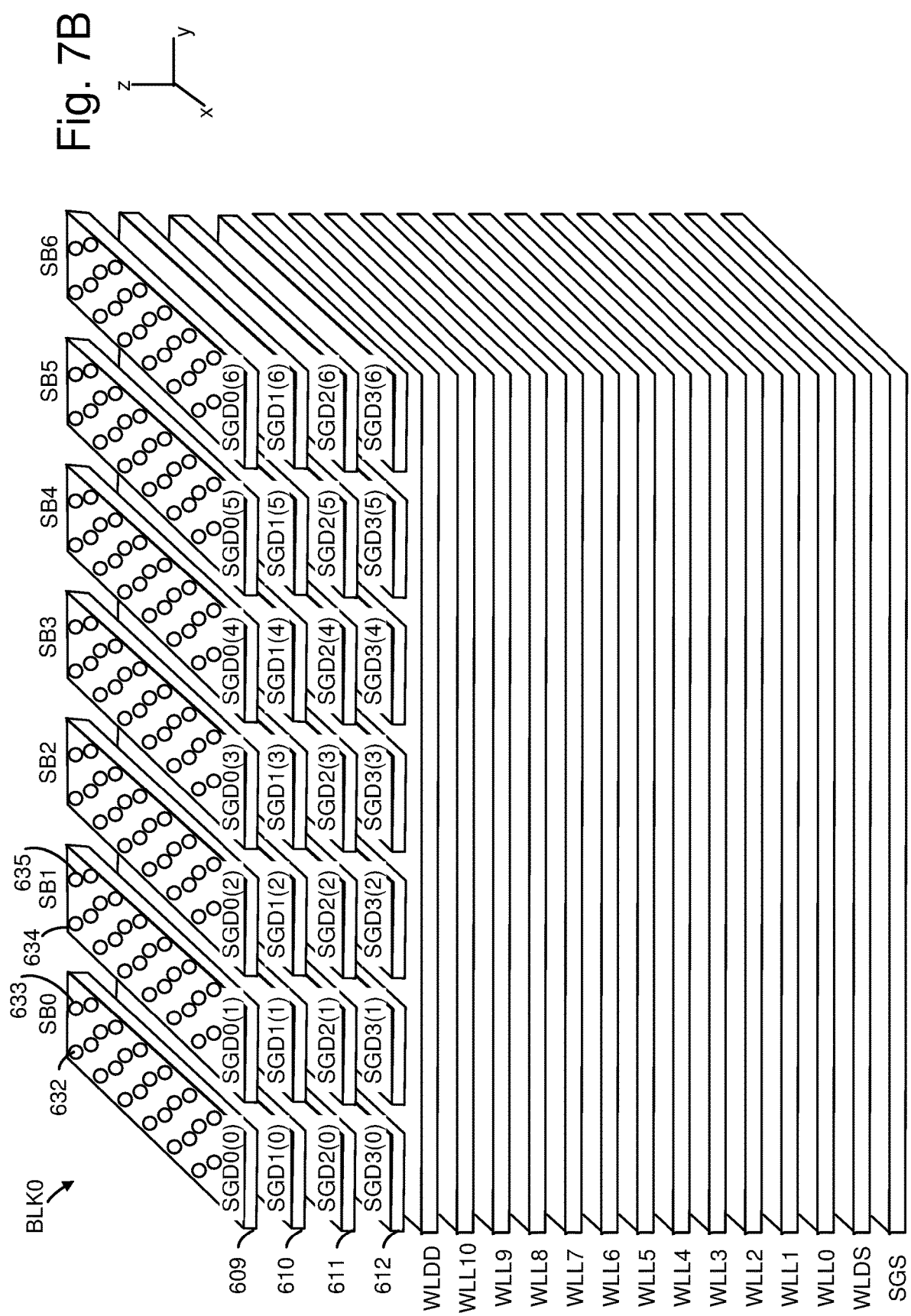
FIG. 7B depicts a perspective view of the conductive layers in the block BLK0 of FIG. 7A.

FIG. 7B depicts a perspective view of the conductive layers in the block BLK0 of FIG. 7A. The control gate layers are arranged in a stack 800 and include dummy word lines layers or control gate layers WLDS0 and WLDD, and data word line layers or control gate layers WLL0-WLL10, which are shared among the different sub-blocks SB0-SB6. Each control gate layer can be a rectangular plate with a height, width and length in the z, y and x direction, respectively. The width of the SGD plate is less than the width of the control gate layer plates of the memory cells. The length of the SGD plate can be the same as the length of the control gate layer plates of the memory cells. The height of the SGD plate can be the same as, or similar to, the height of the control gate layer plates of the memory cells. This example includes seven sub-blocks as an example, but the erase techniques described herein generally apply to the case of two or more sub-blocks in a block.

Moreover, this example assumes that etchant is introduced at two opposing sides of the block, so that the blocking oxide layer is thinnest at the two opposing sides, but other approaches are possible. For example, the etchant can be introduced at one side of the block, so that the blocking oxide layer is thinnest at the one side and become progressively thicker moving away from the one side.

The control gate layers include a common SGS control gate layer for the block, and separate SGD control gate layers for each sub-block. For example, SB0, SB1, SB2, SB3, SB4, SB5 and SB6 include control gate layers SGD0(0)-SGD3(0), SGD0(1)-SGD3(1), SGD0(2)-SGD3(2), SGD0(3)-SGD3(3), SGD0(4)-SGD3(4), SGD0(5)-SGD3(5), and SGD0(6)-SGD3(6), respectively.

Additionally, several example memory holes or NAND strings are depicted by circles at the top of each sub-block, in a simplified example. Example NAND strings 632 and 633 in SB0 and NAND strings 634 and 635 in SB1 are depicted, consistent with FIGS. 8A and 8C. The sub-blocks of FIG. 7B each include 24 memory holes or NAND strings in four rows in a simplified example which is consistent with FIG. 8A.

FIG. 8A depicts a top view of the example block BLK0 of FIG. 7B, where each sub-block comprise four rows of NAND strings. The drain end of each NAND string or memory hole (such as the example NAND strings 632, 633, 634 and 635) is represented by an open circle and a solid circle represents a connection of a bit line to the drain end of the NAND string. Bit lines BL0-BL23 extend in the y-direction across the block, parallel to one another, and spaced apart from one another in the x direction. Each bit line is connected to one NAND string in each sub-block. Additionally, the NAND strings extend in multiple rows in each sub-block, such as rows R1-R4 in SB0 and 1R-4R in SB6. Accordingly, each word line layer of the sub-block comprises corresponding multiple rows of memory cells.

In this example, there are four rows per sub-block, but there could be fewer or more. A thickness of the blocking oxide layer is less for one row (e.g., R1) than another row (e.g., R4) in SB0 when the closest edge 630 of the block is closer to the one row than to the another row. Similarly, a thickness of the blocking oxide layer is less for one row (e.g., 1R) than another row (e.g., 4R) in SB6.

The configuration shown provides a higher density of NAND strings compared to using just one row of NAND string per sub-block, although the techniques described herein can also be used with just one row of NAND strings per sub-block.

The rows and sub-blocks are at various distances from a closest edge of the block. For example, SB0-SB3 are at distances of d1-d3, respectively, from the closest edge 630, and SB6-SB4 are at distances of d1-d3, respectively, from the closest edge 631. The central sub-block, SB3, is at the same distance d4 from either edge 630 or 631. The distance can be taken at the midpoint of a sub-block to the edge, in one approach. In SB0, the rows R1-R4 of NAND strings are at distances d1a-d1d, respectively, from the edge 630. In SB6, the rows 1R-4R of NAND strings are at distances d1a-d1d, respectively, from the edge 631.

In one approach which allows for adjusting the erase speeds of different rows in a sub-block, the even-numbered bit lines are connected to a first set of rows of NAND strings in each sub-block, and the odd-numbered bit lines are connected to a second set of rows of NAND strings in each sub-block. Moreover, in each sub-block, the first set of rows of NAND strings have a higher erase speed than the second set of rows of NAND strings. That is, in each sub-block, a closest edge of the block is closer to the first set of rows of NAND strings than to the second set of rows of NAND strings, and the first set of rows of NAND strings have a smaller blocking oxide layer thickness than the second set of rows of NAND strings. In other words a distance between the first set of rows and the closest edge is less than a distance between the second set of rows and the closest edge.

For instance, in SB0, R1 and R2 are in a first set of rows and are connected to the even-numbered bit lines of BL0-BL22. For instance, the NAND string 632 in R2 is connected to BL22. R3 and R4 are in a second set of rows and are connected to the odd-numbered bit lines of BL1-BL23. For instance, the NAND string 633 in R4 is connected to BL23.

Similarly, in SB6, 1R and 2R are in a first set of rows and are connected to the even-numbered bit lines of BL0-BL22, and 3R and 4R are in a second set of rows and are connected to odd-numbered bit lines of BL1-BL23.

The rows are not labelled in SB1-SB5. However, the rows of SB1 and SB2 follow the pattern of SB0, where the two left hand rows of each sub-block are the faster erasing rows and are connected to the even-numbered bit lines, and the two right hand rows of each sub-block are the slower erasing rows and are connected to the odd-numbered bit lines. The rows of SB4 and SB5 follow the pattern of SB6, where the two right hand rows of each sub-block are the faster erasing rows and are connected to the even-numbered bit lines, and the two left hand rows of each sub-block are the slower erasing rows and are connected to the odd-numbered bit lines. The rows of the central sub-block SB3 are depicted as following the pattern of SB0 but could alternatively follow the pattern of SB6.

To equalize the erase depth of the faster and slower erasing rows or sets of rows of each sub-block, a higher erase voltage can be applied to the slower-erasing rows. For example, in FIG. 13A, the higher erase voltages Verase1-Verase3 can be applied to the bit lines connected to the slower-erasing rows of NAND strings, and the lower erase voltages Verase1a-Verase3a can be applied to the bit lines connected to the faster-erasing rows of NAND strings. A further approach involves using a larger step size for the erase voltage for the slower-erasing rows of NAND strings than for the faster-erasing rows of NAND strings, as depicted in FIG. 13A.

Alternatively, faster erasing rows can be connected to the odd-numbered bit lines, and the slower erasing rows can be connected to the even-numbered bit lines.

In other options, the number of rows per sub-block, the number of sets of rows per sub-block and the number of rows per set can vary. See FIGS. 8D and 8E for additional examples of configurations of rows of NAND strings and their connections to bit lines.

If it is desired to equalize the erase speeds of the different sub-blocks but not the different rows within a sub-block, a common erase voltage can be applied to each of the bit lines in an erase operation, and the erase speed can be adjusted for different sub-blocks by adjusting the SGD transistor voltages as discussed herein.

See also FIG. 8C for further details of a region 640 of the block.

FIG. 8B depicts a plot showing a varying thickness of a blocking oxide layer in the block of FIG. 8A as a function of a distance from a nearest edge of the block. The vertical axis depicts a thickness and the horizontal axis depicts a position along the y direction of the block of FIG. 8A. The thickness ranges from a minimum, Th_min, at the edges 630 and 631, where SB0 and SB6, respectively, are located and increases to a maximum, Th_max, at the center of the block, where SB3 is located.

FIG. 8C depicts the region 640 of FIG. 8A in further detail, showing the varying thickness of a blocking oxide layer. The region includes four example NAND strings, including NAND strings 632 and 633 in SB0, and the NAND strings 634 and 635 in SB1. The edge 630 and a portion 601a of the local interconnect are also depicted. The NAND string 632 includes the components depicted in FIG. 6, including the blocking oxide layer 563, the charge-trapping layer 564, the tunneling layer 565, the channel 560 and the dielectric core 566. The thickness of the blocking oxide layers 563, 563a, 563b and 563c increases progressively from Th_min, Th1, Th2 to Th3 for the NAND strings 632, 633, 634 and 635, respectively.

Figure 8E:
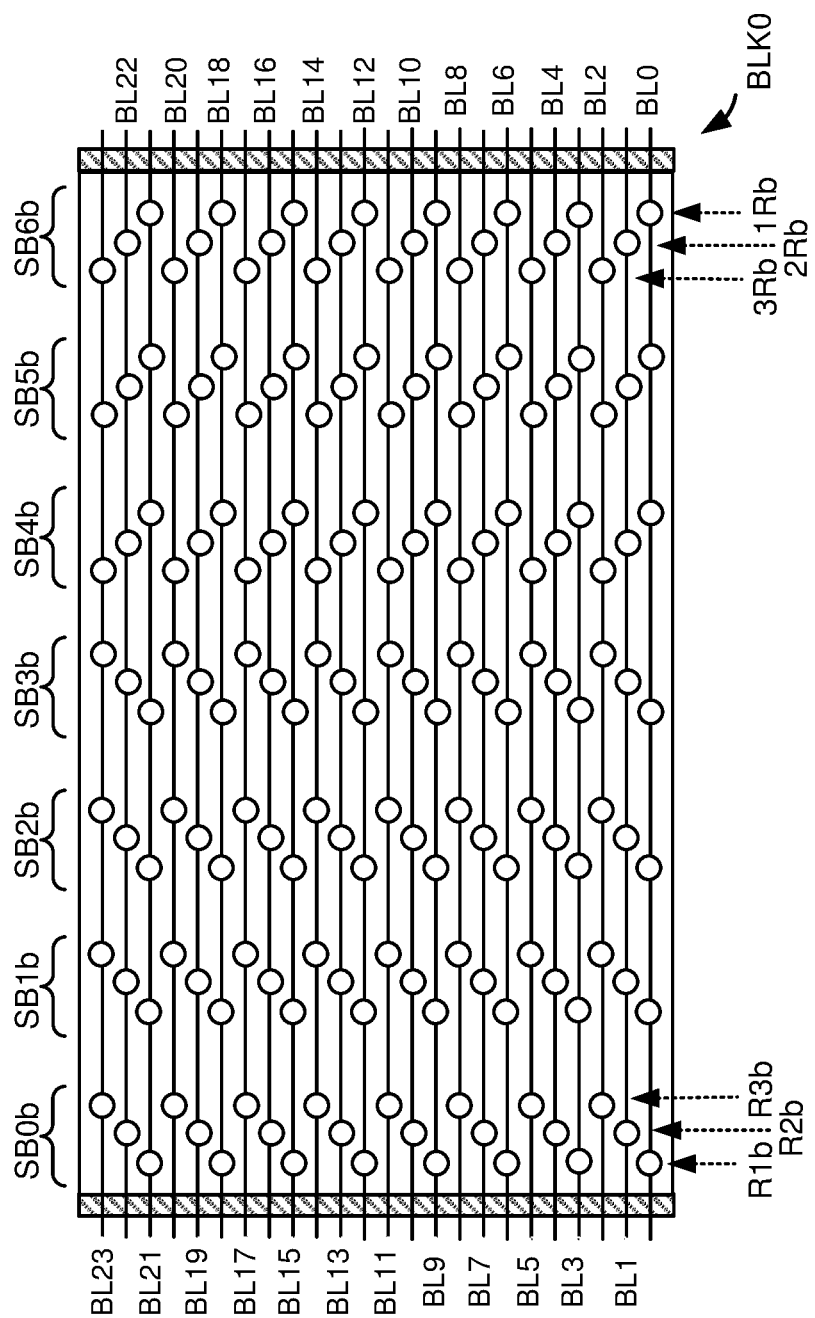
FIG. 8E depicts another example top view of the example block BLK0 of FIG. 7A, where each sub-block comprise three rows of NAND strings.

FIG. 8D depicts another example top view of the example block BLK0 of FIG. 7A, where each sub-block comprise two rows of NAND strings. In FIGS. 8D and 8E, each open circle represents a NAND string. The sub-blocks are SB0a-SB6a. In SB0a, the faster-erasing NAND strings in a row R1a are connected to the even-numbered bit lines and the slower-erasing NAND strings in a row R2a are connected to the odd-numbered bit lines. Similarly, in SB6a, the faster-erasing NAND strings in a row 1Ra are connected to the even-numbered bit lines and the slower-erasing NAND strings in a row 2Ra are connected to the odd-numbered bit lines. SB1a-SB3a follow the pattern of SB0a, and SB4a and SB5a follow the pattern of SB6a.

As mentioned, to equalize the erase depth of the faster and slower erasing rows of each sub-block, a higher erase voltage can be applied to the slower-erasing rows. For example, in FIG. 13A, the higher erase voltages Verase1-Verase3 can be applied to the bit lines connected to the slower-erasing rows of NAND strings, while the lower erase voltages Verase1a-Verase3a are concurrently applied to the bit lines connected to the faster-erasing rows of NAND strings.

FIG. 8E depicts another example top view of the example block BLK0 of FIG. 7A, where each sub-block comprise three rows of NAND strings. The sub-blocks are SB0b-SB6b. The faster-erasing NAND strings in a row R1b of SB0b are connected to every third bit line starting with BL0, e.g., BL0, BL3, BL6, BL9, BL12, BL15, BL18 and BL21. The medium speed-erasing NAND strings in a row R2b of SB0b are connected to every third bit line starting with BL1, e.g., BL1, BL4, BL7, BL10, BL13, BL16, BL19 and BL22. The slower-erasing NAND strings in a row R3b of SB0b are connected to every third bit line starting with BL2, e.g., BL2, BL5, BL8, BL11, BL14, BL17, BL20 and BL23.

To equalize the erase depth of the faster, medium and slower erasing rows of each sub-block, a higher erase voltage can be applied to the slower-erasing rows, a medium erase voltage can be applied to the medium speed erasing rows, and a lower erase voltage can be applied to the faster-erasing rows. Additionally, a relatively large, medium or small step size can be used for the relatively slow, medium and fast erasing rows, respectively, as a further adjustment mechanism.

Similarly, the faster-erasing NAND strings in a row 1Rb of SB6b are connected to every third bit line starting with BL0. The medium speed-erasing NAND strings in a row 2Rb of SB6b are connected to every third bit line starting with BL1. The slower-erasing NAND strings in a row 3Rb of SB6b are connected to every third bit line starting with BL2. SB1b-SB3b follow the pattern of SB0b, and SB4b and SB5b follow the pattern of SB6b.

FIG. 9A-9D depict a block BLK0 and its sub-blocks SB0-SB6. An example NAND string 700n, 710n, 720n, 730n, 740n, 750n and 760n is provided in SB0-SB6, respectively. In each sub-block, multiple NAND strings are provided. The NAND string 700n comprises a channel 700a, SGS transistor 701, source-side dummy memory cell 702, data memory cells 703-713, drain-side dummy memory cell 714 and SGD transistors 715-718.

The NAND string 710n comprises a channel 710a, SGS transistor 721, source-side dummy memory cell 722, data memory cells 723-733, drain-side dummy memory cell 734 and SGD transistors 735-738.

The NAND string 720n comprises a channel 720a, SGS transistor 741, source-side dummy memory cell 742, data memory cells 743-753, drain-side dummy memory cell 754 and SGD transistors 755-758.

The NAND string 730n comprises a channel 730a, SGS transistor 761, source-side dummy memory cell 762, data memory cells 763-773, drain-side dummy memory cell 774 and SGD transistors 775-778.

The NAND string 740n comprises a channel 740a, SGS transistor 781, source-side dummy memory cell 782, data memory cells 783-793, drain-side dummy memory cell 794 and SGD transistors 795-798.

The NAND string 750n comprises a channel 750a, SGS transistor 801, source-side dummy memory cell 802, data memory cells 803-813, drain-side dummy memory cell 814 and SGD transistors 815-818.

The NAND string 760n comprises a channel 760a, SGS transistor 821, source-side dummy memory cell 822, data memory cells 823-833, drain-side dummy memory cell 834 and SGD transistors 835-838.

The SGD transistors 718, 738, 758, 778, 798, 818 and 838 are first, topmost SGD transistors in SB0-SB6, respectively, the SGD transistors 717, 737, 757, 777, 797, 817 and 837 are second SGD transistors in SB0-SB6, respectively, the SGD transistors 716, 736, 756, 776, 796, 816 and 836 are third SGD transistors in SB0-SB6, respectively, and the SGD transistors 715, 735, 755, 775, 795, 815 and 835 are fourth SGD transistors in SB0-SB6, respectively.

The source-ends of the NAND strings are connected to a common source line SL and the drain-ends of the NAND strings are connected to a common bit line BL0.

The use of multiple SGD transistors helps provides a transition region at the end of the NAND string in which the channel voltage can be gradually lowered to reduce channel gradients which can lead to disturbs (Vth upshifts) of the memory cells. Multiple SGD transistors also help ensure that the drain end of a NAND string is cutoff such as when the NAND string is to be inhibited from programming or erasing. However, the techniques described herein can be used with NAND strings having one or more SGD transistors. For example, the connected SGD transistors in each sub-block in FIG. 9A-9D can be replaced by one SGD transistor. Two or more SGD transistors per NAND string can be used with the configurations of FIG. 9B-9D.

FIG. 9A depicts a first example configuration of select gate transistors in the block BLK0 of FIG. 7B. The SGD transistors can be connected in various ways within a NAND string, sub-block and block. In this example, within each sub-block SB0-SB6, the control gates of the SGD transistors 715-718, 735-738, 755-758, 775-778, 795-798, 815-818 and 835-838, respectively, are connected to one another by conductive paths 718*a*, 738*a*, 758*a*, 778*a*, 798*a*, 818*a* and 838*a*, respectively. The control gates of the SGD transistors in different sub-blocks are not connected to one another. In each sub-block, the connected SGD transistors in a NAND string are driven with a common control gate voltage. This provides a simplified implementation because one SGD driver is sufficient for each sub-block.

In an erase operation, GIDL is generated mainly in the first SGD transistor. This approach allows a different amount of GIDL to be generated in different sub-blocks by applying different SGD control gate voltages in different sub-block while a common bit line voltage is applied across all of the sub-blocks, for instance.

Figure 9B:
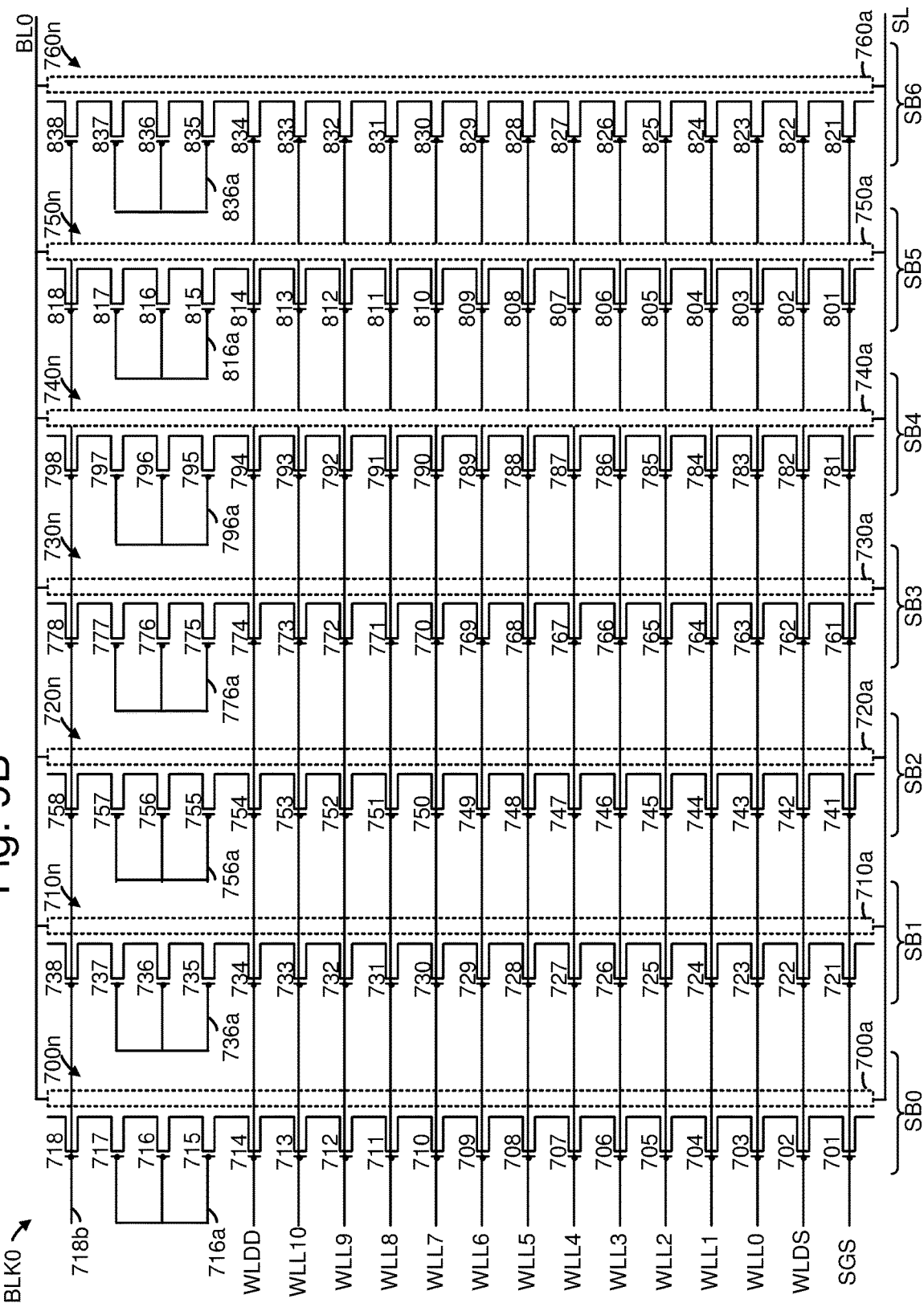
FIG. 9B depicts a second example configuration of select gate transistors in the block BLK0 of FIG. 7B.

FIG. 9B depicts a second example configuration of select gate transistors in the block BLK0 of FIG. 7B. The control gates of the first SGD transistors in different sub-blocks are connected to one another by a common conductive path 718*b*. Within each sub-block SB0-SB6, the control gates of the second through fourth SGD transistors 715-717, 735-737, 755-757, 775-777, 795-797, 815-817 and 835-837, respectively, are connected to one another by conductive paths 716*a*, 736*a*, 756*a*, 776*a*, 796*a*, 816*a* and 836*a*, respectively. This approach allows all NAND strings in a block to be cutoff from the bit lines with a single control gate voltage provided by one SGD driver. It also allows for an equal amount of GIDL to be generated in the different sub-blocks at the first SGD transistors. This erase depth can be adjusted in a sub-block by adjusting the channel conductivity of the remaining SGD transistors.

Figure 9C:
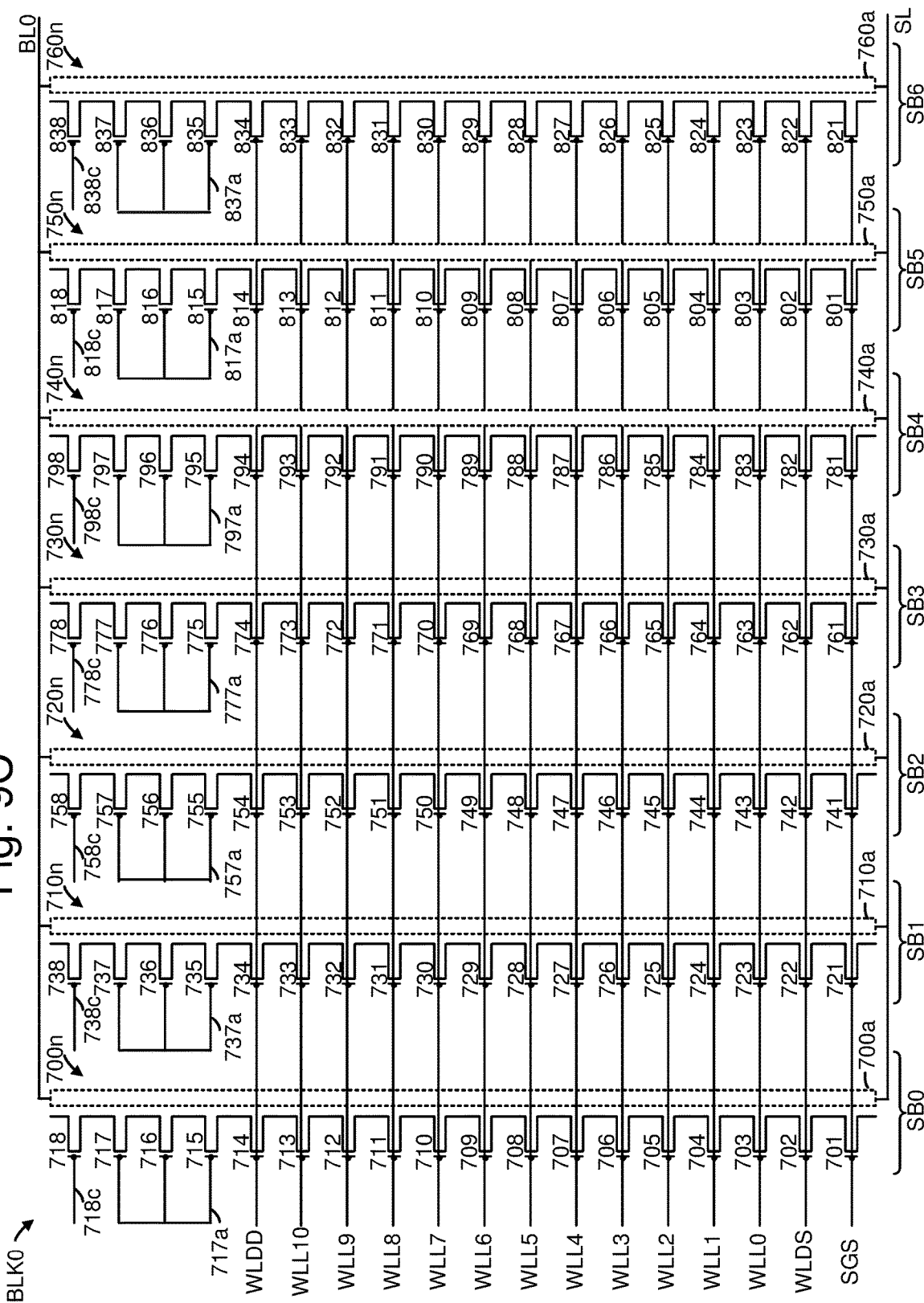
FIG. 9C depicts a third example configuration of select gate transistors in the block BLK0 of FIG. 7B.

FIG. 9C depicts a third example configuration of select gate transistors in the block BLK0 of FIG. 7B. The control gates of the first SGD transistors are disconnected from the control gates of the other SGD transistors in a sub-block. For example, in SB0, the control gate of the first SGD transistor 718 is disconnected from the control gates of 715-717. The control gates of the other SGD transistors in a sub-block are connected to one another and thus can be driven with a common control gate voltage by a respective SGD driver. For example, in SB0, the control gates of the SGD transistors 715-717 are connected to one another.

In the SGD0 layer, conductive paths 718*c*, 738*c*, 758*c*, 778*c*, 798*c*, 818*c* and 838*c* are connected to the control gates of the first SGD transistors in SB0-SB6, respectively.

This configuration allows the erase depth to be adjusted in a sub-block by adjusting both the amount of GIDL generated by the first transistor and the channel conductivity of the remaining SGD transistors.

FIG. 9D depicts a fourth example configuration of select gate transistors in the block BLK0 of FIG. 7B. This configuration is similar to FIG. 9C but adds conductive paths which connect the first SGD transistors in sub-blocks which have an equal erase speed and blocking oxide layer thickness. The first SGD transistors can be connected in sub-blocks which are positioned at common distances from opposing edges of the block. For example, the first SGD transistors 718 and 838 are connected in SB0 and SB6, which are both edge sub-blocks, by a conductive path 718*d*. However, the first SGD transistors 718 and 838 are not connected to first SGD transistors in the remaining sub-blocks such as SB1-SB5. Similarly, the first SGD transistors 738 and 818 are connected in SB1 and SB5, which are both second from the edge sub-blocks, by a conductive path 738*d*. However, the first SGD transistors 738 and 818 are not connected to first SGD transistors in the remaining sub-blocks such as SB0, SB2-SB4 and SB6. Finally, the first SGD transistors 758 and 798 are connected in SB2 and SB4, which are both third from the edge sub-blocks, by a conductive path 758*d*. However, the first SGD transistors 758 and 798 are not connected to first SGD transistors in the remaining sub-blocks such as SB0, SB1, SB3, SB5 and SB6.

This approach allows the first SGD transistors to receive a common control gate voltage in an erase operation so that an equal amount of GIDL is generated in the NAND string channels in sub-blocks which have an equal erase speed and blocking oxide layer thickness. Different amounts of GIDL can be generated in the NAND string channels in sub-blocks which have different erase speeds and blocking oxide layer thickness. The number of SGD drivers can be reduced in this configuration, compared to FIG. 9C, for example.

In one approach, the NAND strings in a block comprise a first select gate transistor at a drain-end of the NAND strings, a pair of the sub-blocks (e.g., the pair of SB0 and SB6, SB1 and SB5, or SB2 and SB4) have equal erase speeds (e.g., are at an equal distance from a closest edge of opposing edges of the block), and control gates of the first select gate transistors in the pair of the sub-blocks having equal erase speeds are connected to one another. Further, a control circuit may be configured to, in an erase operation for the block, charge up channels of NAND strings in the pair of the sub-blocks having the equal erase speed to a same voltage.

FIG. 10A depicts threshold voltage (Vth) distributions of a set of memory cells after a program operation. The memory cells are initially in the erased (Er) state as represented by a Vth distribution 910. In an erase operation, the data memory cells transition from the Vth distributions of the programmed data states, e.g., states A-G, to the erased state. The erase operation can include multiple erase-verify loops. In each loop, the memory cells are biased for erasing after which an erase-verify test is performed. The erase-verify test can use an erase verify voltage, VvEr, which is applied to the word lines.

After a program operation, the memory cells assigned to the A-G states are programmed to the Vth distributions 911-917, respectively. A program operation can include multiple program loops in which a program pulse is applied to a selected word line, after which a program-verify test is performed by applying one or more of the verify voltages VvA-VvG to the selected word line and sensing whether the memory cells are in a non-conductive state. The memory cells assigned to the Er state are not programmed and continue to be represented by the Vth distribution 910. The memory cells which are programmed to the A-G states are subject to verify tests using the verify voltages of VvA-VvG, respectively.

Read voltages VrA, VrB, VrC, VrD, VrE, VrF and VrG can be used for reading the states of the memory cells in a read operation.

FIG. 10B depicts Vth distributions of memory cells of different sub-blocks which have different erase speeds at the end of an erase operation, when a relatively large erase voltage duration and a relatively small number of erase loops are used. In this example, consistent with FIGS. 7A, 7B, 8A and 9A-9D, there are seven sub-blocks with four different erase speeds represented by four different Vth distributions. In particular, the Vth distribution 920 represents SB0 and SB6. These are the edge sub-blocks and have the highest erase speed so their Vth is the lowest. The Vth distribution 921 represents SB1 and SB5. These are the second from the edge sub-blocks and have the second highest erase speed so their Vth is the second lowest. The Vth distribution 922 represents SB2 and SB4. These are the third from the edge sub-blocks and have the third highest erase speed so their Vth is the third lowest. The Vth distribution 923 represents SB3. This is the fourth from the edge sub-block, and the central sub-block, and has the fourth highest erase speed (e.g., the lowest erase speed) so its Vth is the fourth lowest (e.g., the highest Vth).

This example assumes that the different erase speeds of the different sub-blocks are not compensated during an erase operation using the techniques described herein. As a result, there is a significant different in the erase depths of the different sub-blocks. This can lead to various problems including damage to the memory cells and non-optimized programming. For example, the number of program loops needed to complete an erase operation can increase, resulting in a performance penalty, if the erase depth is lower than what is optimal.

An erase operation typically involves a few, e.g., two-five, erase loops, where each erase loop involves applying a relatively long erase voltage to a block. The process of charging up the channels is relatively time consuming so that the erase voltage has to be maintained for a relatively long time to achieve an erasing effect on the memory cells. As a result, it is difficult to avoid over-erasing of the fastest erasing sub-blocks.

The erase speed can be measured by how low the Vth is at the end of an erase operation, in one approach. The erase speed can also be measured by how much the Vth decreases with each successive erase pulse.

FIG. 10C depicts Vth distributions of memory cells of different sub-blocks which have different erase speeds at the end of an erase operation, when a relatively small erase voltage duration and a relatively large number of erase loops are used. The problem of over-erasing as mentioned above can be addressed by erasing the sub-blocks in a finer grained manner by using a shorter erase pulse duration.

In this case, the Vth distribution 920a represents SB0 and SB6, the Vth distribution 921a represents SB1 and SB5, the Vth distribution 922a represents SB2 and SB4, and the Vth distribution 923a represents SB3. The amount of over-erase of the fastest erasing sub-blocks is reduced compared to FIG. 10B. A disadvantage is that the time to complete the erase operation is increased because additional erase loops are needed. Using the techniques described herein, the amount of erase, e.g., as measured by the amount of Vth downshift, in each erase loop, can be equalized among the different sub-blocks by adjusting the amount of charging up of the channels of the different sub-blocks and/or the SGD transistor channel conductivity. Ideally, the Vth distributions of the different sub-blocks will be relatively close together as in FIG. 10C, while the time to complete the overall erase operation is relatively short as in FIG. 10B.

Figure 11A:
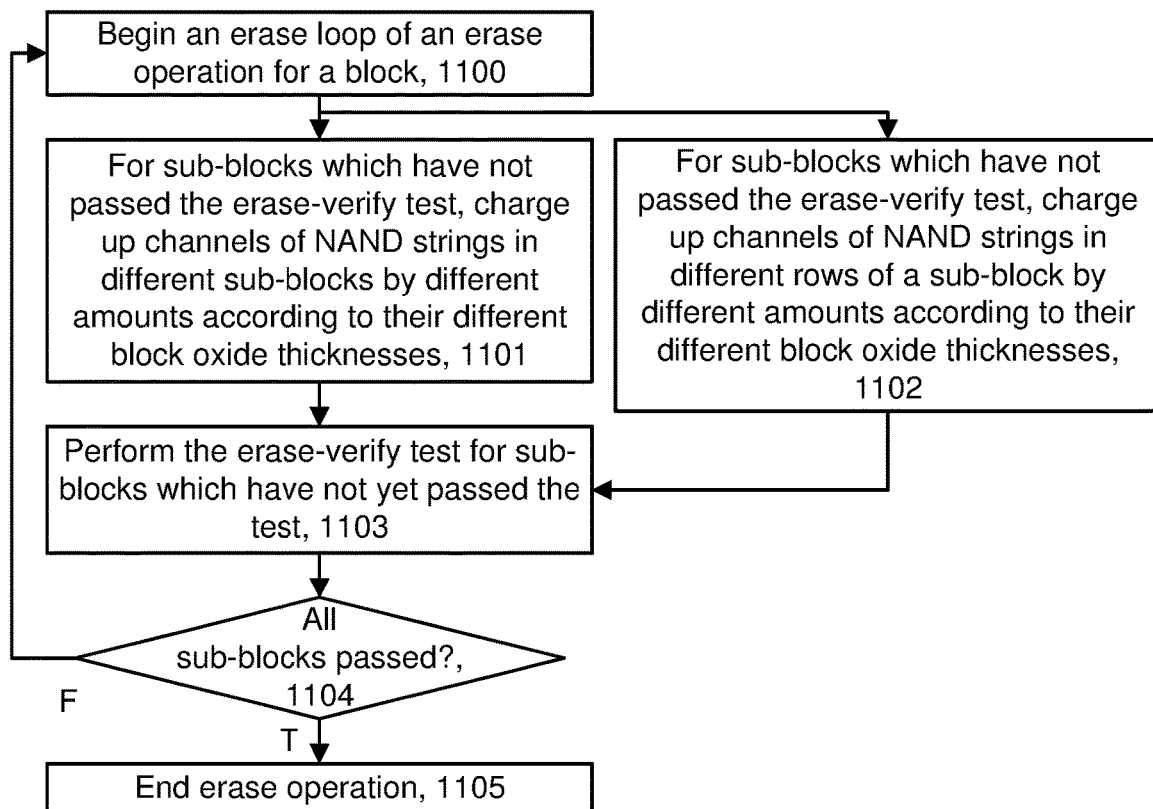
FIG. 11A depicts a flowchart of an example erase operation of a block which accounts for different erase speeds of different sub-blocks.

FIG. 11A depicts a flowchart of an example erase operation of a block which accounts for different erase speeds of different sub-blocks. Step 1100 begins an erase loop of an erase operation for a block. In one option, step 1101 includes, for sub-blocks which have not passed an erase-verify test, charging up the channels of the NAND strings in the different sub-blocks by different amounts according to their different blocking oxide thicknesses. For instance, a sub-block with a relatively small blocking oxide thickness (e.g., SB0 and SB6), and therefore a relatively high erase speed, can be charged up by a relatively small amount.

In another option, step 1102 includes, for sub-blocks which have not passed an erase-verify test, charging up the channels of the NAND strings in different rows of a sub-block by different amounts according to their different blocking oxide thicknesses. For instance, a row with a relatively small blocking oxide thickness (e.g., R1 or 1R in FIG. 8A), and therefore a relatively high erase speed, can be charged up by a relatively small amount.

Subsequently, step 1103 includes performing the erase-verify test for sub-blocks which have not yet passed the test. A decision step 1104 determines whether all, or nearly all, of the sub-blocks in a block have passed the erase-verify test. If the decision step 1104 is true, the erase operation ends at step 1105. If the decision step 1104 is false, the erase operation continues with another erase loop at step 1105.

During an erase loop, sub-blocks which have passed the erase-verify test are inhibited from further erasing. This inhibiting can be achieved by setting the control gate voltage of the first SGD transistors to a relatively high level which is similar to the erase voltage. This reduces the drain-to-gate voltage of the first SGD transistors to a level which does not cause a significant amount of GIDL.

In one approach, after charging up of the channels of the NAND strings in the plurality of sub-blocks in an erase loop, a control circuit is configured to identify one or more sub-blocks which have passed an erase-verify test and one or more sub-blocks which have not passed the erase-verify test and, in response to the determination, continue the erase operation for the one or more sub-blocks which have not passed the erase-verify test while inhibiting a further erasing of the one or more sub-blocks which have passed the erase-verify test, in one or more additional erase loops of an erase operation.

See FIG. 11D to 11G for further details of example erase operations.

Figure 11B:
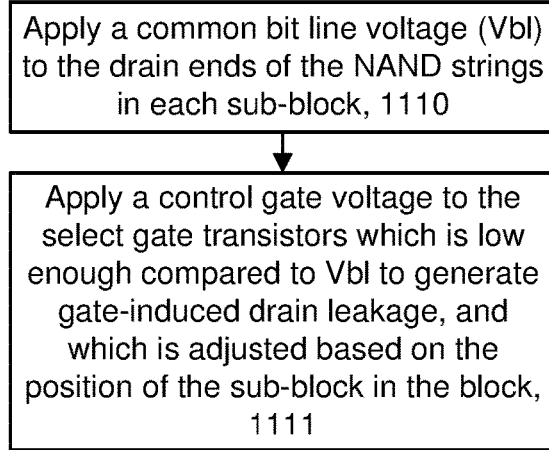
FIG. 11B depicts a flowchart of a process for implementing step 1101 of FIG. 11A.

FIG. 11B depicts a flowchart of a process for implementing step 1101 of FIG. 11A. Step 1110 includes applying a common bit line voltage to the drain ends of the NAND strings in each sub-block. Step 1111 includes applying a control gate voltage to the select gate transistors which is low enough compared to Vbl to generate gate-induced drain leakage, and which is adjusted based on the position of the sub-block in the block (and therefore based on the blocking oxide thickness of the NAND string channels in the sub-block).

Figure 11C:
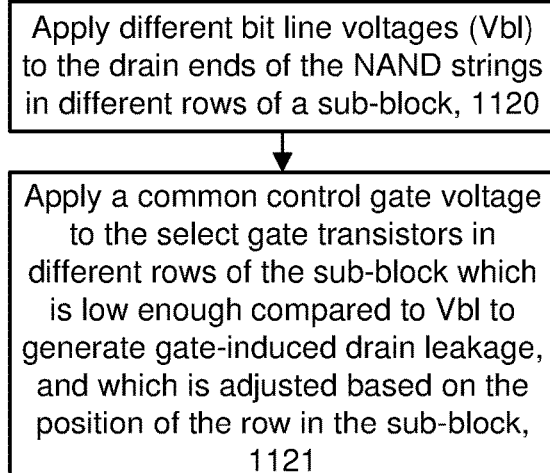
FIG. 11C depicts a flowchart of a process for implementing step 1102 of FIG. 11A.

FIG. 11C depicts a flowchart of a process for implementing step 1102 of FIG. 11A. Step 1120 includes applying different bit line voltages to the drain ends of the NAND strings in different rows of a sub-block. Step 1121 includes applying a common control gate voltage to the select gate transistors in different rows of the sub-block which is low enough compared to Vbl to generate gate-induced drain leakage, and which is adjusted based on the position of the row in the sub-block (and therefore based on the blocking oxide thickness of the NAND string channels in the row).

As described further in connection with FIG. 13A, a different erase voltage can be applied on the odd-numbered bit lines compared to the even-numbered bit lines. A lower bit line voltage can be applied to the rows which have a higher erase speed due to a smaller blocking oxide layer thickness. This helps reduce the erase speed of the row and equalize erase speeds across the different rows of a sub-block. For instance, if the first set of rows of NAND strings have a higher erase speed, a lower erase voltage (e.g., Verase1a-Verase3a in FIG. 13A) can be applied to the even-numbered bit lines compared to an erase voltage (e.g., Verase1-Verase3 in FIG. 13A) which is applied to the odd-numbered bit lines.

In one approach, one edge sub-block (e.g., SB0 in FIG. 8A) comprises multiple rows of NAND strings (R1-R4) including one row (R1) and another row (R4); an edge 630 of the block is closer to the one row than to the another row, and a control circuit is configured to, in an erase operation, charge up channels of NAND strings in the another row by a greater amount than an amount to which NAND strings in the one row are charged up.

Further, the control circuit, to charge up the channels of the NAND strings in the another row by the greater amount than the amount to which the NAND strings in the one row are charged up, may be configured to apply an erase voltage (e.g., Verase1-Verase3 in FIG. 13A) to drain ends of the NAND strings in the another row which is higher than an erase voltage (e.g., Verase1a-Verase3a in FIG. 13A) which is applied concurrently to drain ends of the NAND strings in the one row.

Further, the multiple rows of NAND strings in the one edge sub-block may each comprise a first select gate transistor at a drain-end of the multiple rows of NAND strings, where control gates of the first select gate transistors are connected to one another.

Further, a thickness of the blocking oxide layer (see FIG. 8C) may be less in the one row than in the another row.

Figure 11E:
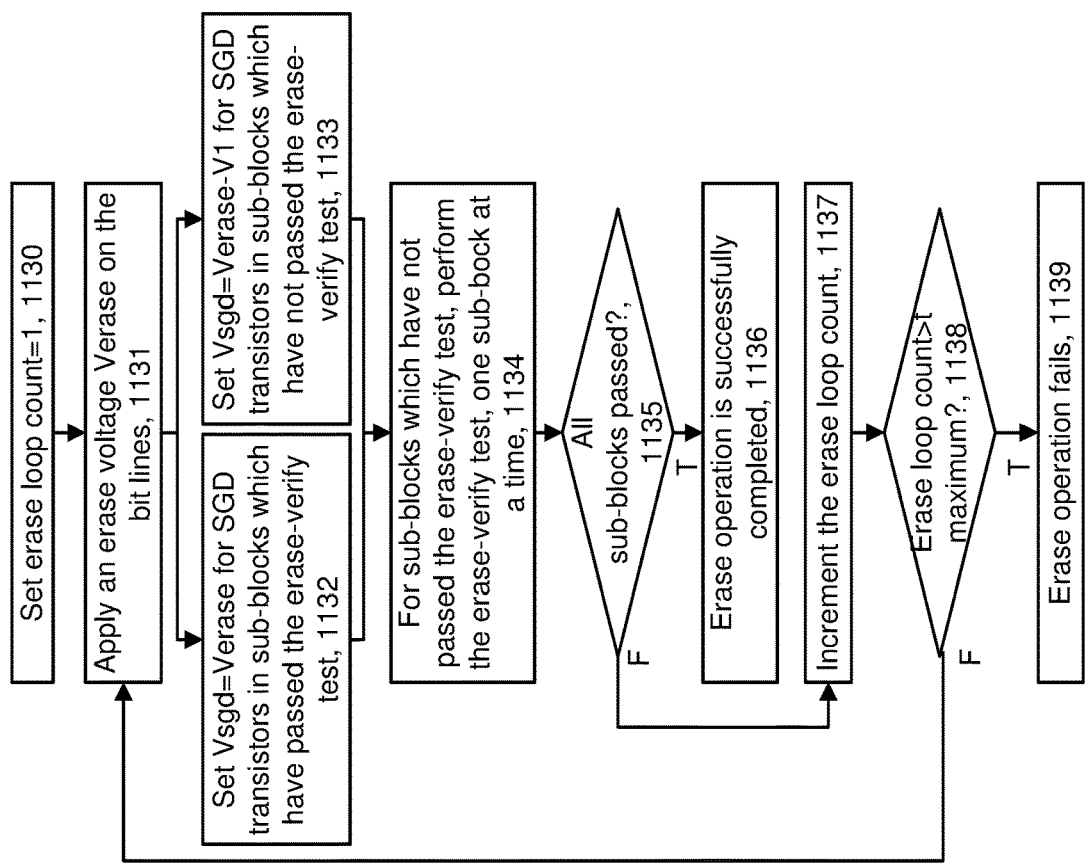
FIG. 11E depicts an example erase operation consistent with the configuration of SGD transistors in FIG. 11D.
Figure 11D:
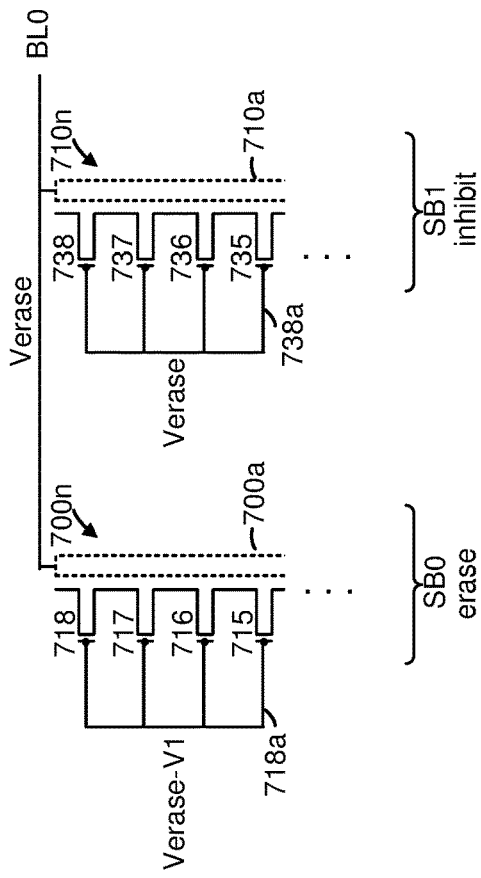
FIG. 11D depicts a portion of the block of FIG. 9A and voltages used in an example erase operation.

FIG. 11D depicts a portion of the block of FIG. 9A and voltages used in an example erase operation. The SGD transistors in SB0 and SB1 are depicted with the bit line BL0. SB0 is an example of a sub-block which has not completed erasing and SB1 is an example of a sub-block which has completed erasing.

As mentioned, in this configuration, the control gates of the SGD transistors are all connected to one another in each NAND string and in the sub-block. The control gates of the SGD transistors are not connected to one another in different sub-blocks. Accordingly, one control gate voltage, Verase-V1, can be used for selected sub-blocks such as SB0, which have not completed erasing, and another control gate voltage Verase can be used for unselected sub-blocks such as SB1, which have completed erasing. The drain-to-gate voltage of the first transistor 718 in the NAND string 700*n* is V1, e.g., 10 V or more, which is sufficient to generate GIDL so that the associated channel 700*a* is charged up and the memory cells can be erased. The drain-to-gate voltage of the first transistor 738 in the NAND string 710*n* is 0 V, which is insufficient to generate GIDL, so that the associated channel 710*a* is not charged up and the memory cells are not erased. The NAND strings is thus inhibited from being erased.

FIG. 11E depicts an example erase operation consistent with the configuration of SGD transistors in FIG. 11D. An erase loop count is set to one at step 1130. An erase voltage, Verase, is applied to the bit lines at step 1131. Step 1132 sets Vsgd=Verase for the SGD transistors in the sub-blocks which have passed the erase verify test, to prevent erasing. At the same time, step 1133 sets Vsgd=Verase-V1 for the SGD transistors in the sub-blocks which have not passed the erase verify test, to allow erasing. At step 1134, the erase-verify test is performed, one sub-block at a time, for the sub-blocks which have not yet passed the erase-verify test. A decision step 1135 determines if all sub-blocks have passed the erase-verify test. If decision step 1135 is true, the erase operation is successfully completed at step 1136. If decision step 1135 is false, the erase loop count is incremented at step 1137.

A decision step 1138 determines if the erase loop count exceeds a maximum allowed erase loop count. If decision step 1138 is true, the erase operation fails at step 1139. If decision step 1138 is false, the next erase voltage is applied at step 1131 and a next erase loop begins.

FIG. 11F depicts a portion of the block of FIG. 9B and voltages used in an example erase operation. The SGD transistors in SB0 and SB1 are depicted with the bit line BL0. As mentioned, in this configuration, the control gates of the first SGD transistors (also referred to as top SGD transistors, SGDT) are all connected to one another in each NAND string and among the different sub-blocks. The control gates of the $2^{nd}$-$4^{th}$ SGD transistors are connected to one another in each sub-block but not among different sub-blocks. Accordingly, a common control gate voltage, Verase-V1, can be used for the first SGD transistors.

Additionally, a control voltage Verase-V0 can be used for the control gates of the $2^{nd}$-$4^{th}$ SGD transistors in selected sub-blocks such as SB0, which have not completed erasing, and another control gate voltage Verase can be used for unselected sub-blocks such as SB1, which have completed erasing. The drain-to-gate voltage of the first transistors 718 and 738 is V1, e.g., 10 V or more, which is sufficient to generate GIDL. V0 can be, e.g., about 8 V. V0 should not be too high or the under drive may potentially damage the $2^{nd}$-$4^{th}$ SGD transistors.

The drain-to-gate voltage of the $2^{nd}$-$4^{th}$ SGD transistors 717-715, respectively, in SB0 is sufficiently low to cause the associated regions of the channel 700*a* to be strongly conductive to holes so that the holes can reach portions of the channel adjacent to the memory cells. These SGD transistors therefore have a strong under drive, e.g., drain to gate voltage. In contrast, the under drive of the $2^{nd}$-$4^{th}$ SGD transistors 737-735, respectively, in SB1 is 0 V or otherwise sufficiently low to cause the associated regions of the channel 710*a* to be non-conductive or weakly conductive to holes so that the holes cannot reach portions of the channel adjacent to the memory cells. These NAND string is thus inhibited from being erased.

FIG. 11G depicts an example erase operation consistent with the configuration of SGD transistors in FIG. 11F. An erase loop count is set to one at step 1140. An erase voltage, Verase, is applied to the bit lines at step 1141. Step 1142 sets Vsgd=Verase-V1 for the 1st SGD transistors in each sub-block to generate GIDL, as mentioned. Step 1143 sets Vsgd=Verase for the $2^{nd}$-$4^{th}$ SGD transistors in the sub-blocks which have passed the erase verify test, to prevent erasing. At the same time, step 1144 sets Vsgd=Verase-V0 for the SGD transistors in the sub-blocks which have not passed the erase verify test, to allow erasing. At step 1145, the erase-verify test is performed, one sub-block at a time, for the sub-blocks which have not yet passed the erase-verify test. A decision step 1146 determines if all sub-blocks have passed the erase-verify test. If decision step 1146 is true, the erase operation is successfully completed at step 1147. If decision step 1146 is false, the erase loop count is incremented at step 1148.

A decision step 1149 determines if the erase loop count exceeds a maximum allowed erase loop count. If decision step 1149 is true, the erase operation fails at step 1150. If decision step 1149 is false, the next erase voltage is applied at step 1141 and a next erase loop begins.

FIG. 12A depicts a table of example voltages used in an erase operation consistent with FIG. 9A. In FIG. 12A-12D, the voltages are examples and other values can be used. Vsgd0-3 denotes a control gate voltage of the first through fourth SGD transistors in the various sub-blocks. Vsgd0-3 refers to Vsgd0, Vsgd1, Vsgd2 and Vsgd3. These are control gate voltages applied to the SGD layers SGD0, SGD1, SGD2 and SGD3, respectively, in FIG. 7A. Referring to FIG. 9A, Vsgd0 is applied to the SGD transistors 718, 738, 758, 778, 798, 818 and 838. Vsgd1 is applied to the SGD transistors 717, 737, 757, 777, 797, 817 and 837. Vsgd2 is applied to the SGD transistors 716, 736, 756, 776, 796, 816 and 836. Vsgd3 is applied to the SGD transistors 715, 735, 755, 775, 795, 815 and 835.

FIG. 12A-12D each provide an example of equalizing an erase depth in different sub-blocks which have different erase speeds.

In FIG. 12A, Vsgd0=Vsgd1=Vsgd2=Vsgd3. Vsgd0-3=15 V in SB0 and SB6, 14 V in SB1 and SB5, 13 V in SB2 and SB4, and 2 V in SB3. Thus, the SGD voltage is progressively lower for sub-blocks which are progressively further from a nearest edge of the block and therefore have a progressively thicker blocking oxide layer and a progressively lower erase speed.

The amount of GIDL indicates the peak voltage (Vch) to which the channel is charged up due to the application of an erase pulse. The amount of GIDL in a NAND string is higher when the drain-to-gate voltage of the first SGD transistor of the NAND string is higher. Thus, for a given Vbl at the drain-end of the NAND string, the amount of GIDL is higher when the control gate voltage of the SGD transistor is lower. The GIDL and Vch are low for SB0 and SB6, medium-low for SB1 and SB5, medium high for SB2 and SB4 and high for SB3. The memory cells may have their control gate voltages set at a relatively low level such as 0 V when the channel is charged up, and are more strongly erased when Vch is higher, since this results in a higher channel-to-gate voltage.

The second through fourth SGD transistors control a conductivity of an associated portion of the NAND string channels. When the control gate voltage of these transistors is relatively high, there is a relatively low conductivity for holes moving downward in the NAND strings. Vsgd0-3 is at a level which is sufficiently low compared to Vbl to cause the first SGD transistors to generate holes, due to a sufficiently high drain-to-gate voltage, and to cause the second through fourth SGD transistors to have a sufficiently high conductivity to holes in their channel regions, so that the holes can move to the channel regions adjacent to the memory cells.

FIG. 12B depicts a table of example voltages used in an erase operation consistent with FIG. 9B. In FIG. 9B, the control gates of the first select gate transistors in the different sub-blocks are connected so that an equal amount of GIDL will be generated at the first SGD transistors of the NAND strings of the different sub-blocks when Vsgd0 is applied to the conductive path 718b. However, the conductivity in the associated channel regions of the second through fourth SGD transistors is different in different sub-blocks because Vsgd1-3 is different in different sub-blocks. Vsgd1-3 refers to Vsgd1, Vsgd2 and Vsgd3. These are control gate voltages applied to the SGD layers SGD1, SGD2 and SGD3, respectively, in FIG. 7A.

Vsgd0=10 V for each of the sub-blocks. This is sufficiently low compared to Vbl to cause the first SGD transistors to generate a relatively high amount of GIDL. Moreover, Vsgd1-3=15 V for SB0 and SB6, 14 V for SB1 and SB5, 13 V for SB2 and SB4, and 12 V for SB3. This SGD voltage is progressively lower for sub-blocks which are progressively further from a nearest edge of the block. As a result, the conductivity for holes is progressively higher for sub-blocks which are progressively further from a nearest edge of the block, and the amount of channel charge up (Vch) is progressively higher as the conductivity for holes is progressively higher. SGD cond. denotes the conductivity of the SGD channel regions. SGD cond. and Vch are low for SB0 and SB6, medium-low for SB1 and SB5, medium-high for SB2 and SB4, and high for SB3. Vch follows the trend of SGD cond.

FIG. 12C depicts a table of example voltages used in an erase operation consistent with FIG. 9C. Vsgd0 is set as in FIG. 12A, e.g., to 15 V for SB0 and SB6, 14V for SB1 and SB5, 13 V for SB2 and SB4, and 12 V for SB3. As a result, different amounts of GIDL are generated at the first SGD transistors in different sub-blocks. The GIDL is low for SB0 and SB6, medium-low for SB1 and SB5, medium high for SB2 and SB4 and high for SB3. Vsgd1-3 is set to a low level so that the conductivity to holes in the associated channel regions is high. This allows the holes generated by GIDL to easily move downward in the NAND string channel to portions of the channel which are adjacent to the memory cells. Vch follows the trend of FIGS. 12A and 12B. SGD cond. and Vch are low for SB0 and SB6, medium-low for SB1 and SB5, medium-high for SB2 and SB4, and high for SB3. Vch follows the trend of SGD cond.

FIG. 12D depicts another table of example voltages used in an erase operation consistent with FIG. 9C. This example differs from FIG. 12C in that Vsgd1-3 is different in different sub-blocks. Specifically, Vsgd1-3 can follow the trend of FIG. 12B, where Vsgd1-3 is higher for the sub-blocks with a higher erase speed, so that the erase speed of these sub-blocks is slowed.

In sum, the amount of charging up of the channels can be adjusted by a first mechanism which involves adjusting the amount of GIDL and/or by a second mechanism which involves adjusting a conductivity of the SGD transistor channels. FIGS. 12A and 12 C involve the first mechanism, FIG. 12B involves the second mechanism, and FIG. 12D involves the first and second mechanisms.

Figure 13E:
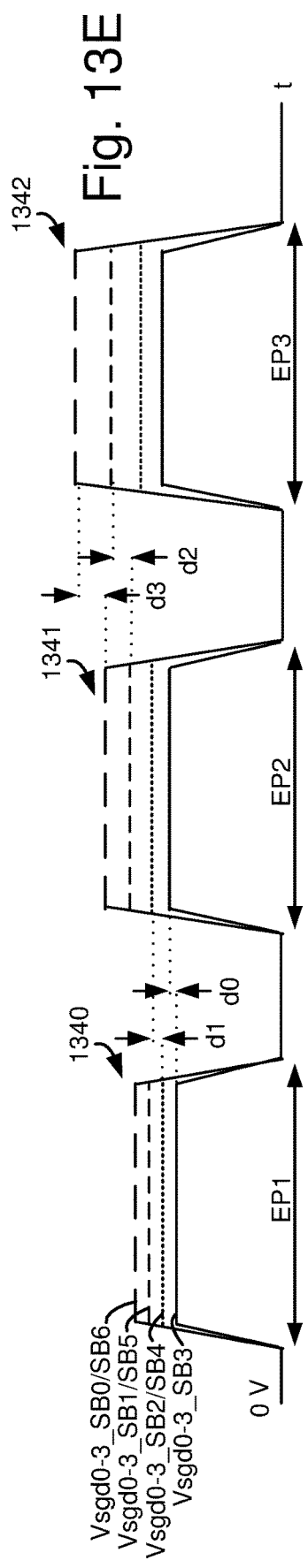
FIG. 13E depicts an example sequence of control gate voltages for select gate transistors, as an alternative to FIG. 13B.

FIG. 13A depicts an example sequence of erase pulses in an erase operation. In FIG. 13A-13G, the vertical direction denotes voltage and the horizontal direction denotes a common time axis.

The sequence includes three erase pulses or voltages in three erase loops EL1-EL3. Each erase loop includes an erase pulse EP1-EP3 and a verify pulse VP1-V3 (see FIG. 13D). The erase pulse may represent a bit line voltage, for example, which is applied to the drain ends of the NAND strings. The erase voltage may increase from an initial level such as 0 V to a relatively high positive voltage such as 20 V in EL1 and then return to 0 V. The peak erase voltage may step up in magnitude in each successive erase loop, in one approach. For example, Verase1 (plot 1301) or Verase1a (plot 1301a) may be used in ELL Verase2 (plot 1302) or Verase2a (plot 1302a) may be used in EL2, and Verase3 (plot 1303) or Verase3a (plot 1303a) may be used in EL3.

As mentioned, e.g., in connection with FIGS. 8A and 8D, the higher erase voltages of Verase1-Verase3 may be used for slower-erasing rows of NAND strings in a sub-block and the lower erase voltages of Verase1a-Verase3a may be used for faster-erasing rows of NAND strings in a sub-block. Additionally, the step size of the erase pulse over the successive erase loops can be greater for the higher erase voltages than for the lower erase voltages, as a further measure to slow down the erase speed of the fast-erasing rows.

In another option, the erase voltage steps up to its peak level in each erase loop in two steps instead of one to allow time for the charge up of the channel to occur. The SGD voltage (FIG. 13B) can also step up to its peak level in two steps.

FIG. 13B depicts an example sequence of control gate voltages for select gate transistors, consistent with FIGS. 12A and 13A. The sets of control gates voltages depicted by sets of plots 1310, 1311 and 1312 are applied during EP1, EP2 and EP3, respectively. As depicted in FIG. 12A, examples voltages for Vsgd0-3 in SB0 and SB6, SB1 and SB5, SB2 and SB4, and SB3, are 15 V, 14 V, 13V and 12 V, respectively, and are denoted by Vsgd0-3_SB0/SB6, Vsgd0-3_SB1/SB5, Vsgd0-3_SB2/SB4, and Vsgd0-3_SB3, respectively. The same set of control gates voltages may be applied during each erase pulse, in one approach.

FIG. 13C depicts an example of channel voltages consistent with FIGS. 13A and 13B. When the first erase pulse is applied, the channels of the NAND strings in SB3, SB2 and SB4, SB1 and SB5, and SB0 and SB6, are increased from an initial level such as 0 V to elevated levels Vch_SB3, Vch_SB2/SB4, Vch_SB1/SB5 and Vch_SB0/SB6, respectively, as represented by the a set of plots 1320. The sub-blocks with a fastest erase speed have their channels charged up to a lowest level. When the second erase pulse is applied, the channel voltages of the NAND strings are increased from the levels reached in the first loop to higher levels, as represented by a set of plots 1321. When the third erase pulse is applied, the channels of the NAND strings are increased from the levels reached in the second erase loop to higher levels, as represented by a set of plots 1322.

FIG. 13D depicts an example sequence of word line voltages consistent with FIGS. 13A and 13B. Plots 1330, 1332 and 1334 represent the word line voltages during the erase pulses of EP1, EP2 and EP3. The word line voltages may be set to a low level such as 0 V during the application of the erase pulses to provide a large channel-to-gate voltage for the memory cells. The erase loops EL1-EL3 include also verify pulses VP1-VP3, respectively, in which the plots 1331, 1333 and 1335 represent the word line voltage (e.g., an erase-verify voltage) during an erase-verify test. The erase-verify voltage can be small positive voltage such as 0.5 V, as depicted, 0 V, or a negative voltage.

FIG. 13E depicts an example sequence of control gate voltages for select gate transistors, as an alternative to FIG. 13B. In this example, the SGD control gate voltage steps up in the successive erase loops. Moreover, a step size is greater for the slower-erasing sub-blocks. Recall that a larger SGD control gate voltage results in less GIDL and therefore less charging up of the NAND string channels and less erasing of the memory cells. In particular, a progressively larger step size of d0, d1, d2 or d3 is used for the progressively faster erasing sub-blocks of SB3, SB2 and SB4, SB1 and SB5, and SB0 and SB6, respectively. The SGD control gate voltage is Vsgd0-3_5B3, Vsgd0-3_SB2/SB4, Vsgd0-3_SB1/SB5 and Vsgd0-3_SB0/SB6 for sub-blocks of SB3, SB2 and SB4, SB1 and SB5, and SB0 and SB6, respectively. Sets of plots 1340, 1341 and 1342 represents the SGD voltages during EP1, EP2 and EP3, respectively. Using different SGD voltages for a sub-block during different erase pulses provides a further mechanism for equalizing erase speeds in different sub-blocks, in addition to the general idea of using different SGD voltages for different sub-blocks during an erase operation.

Figure 13F:
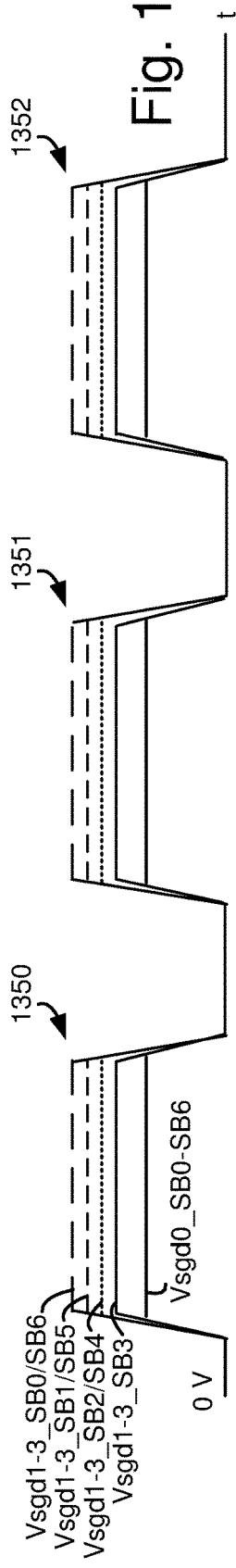
FIG. 13F depicts an example sequence of control gate voltages for select gate transistors, consistent with FIGS. 12B and 13A.

FIG. 13F depicts an example sequence of control gate voltages for select gate transistors, consistent with FIGS. 12B and 13A. FIG. 13F differs from FIG. 13E in that the voltages which represent Vsgd0-3_SB3, Vsgd0-3_SB2/SB4, Vsgd0-3_SB1/SB5 and Vsgd0-3_SB0/SB6 in FIG. 13E may represent Vsgd1-3_SB3, Vsgd1-3_SB2/SB4, Vsgd1-3_SB1/SB5 and Vsgd1-3_SB0/SB6, respectively, in FIG. 13F. Additionally, the voltage of the first SGD transistor, which is common among the sub-blocks SB0-SB6, is represented by Vsgd0_SB0-SB6, and is lower than the other SGD voltages. Sets of plots 1350, 1351 and 1352 represents the SGD voltages during EP1, EP2 and EP3, respectively.

Figure 13G:
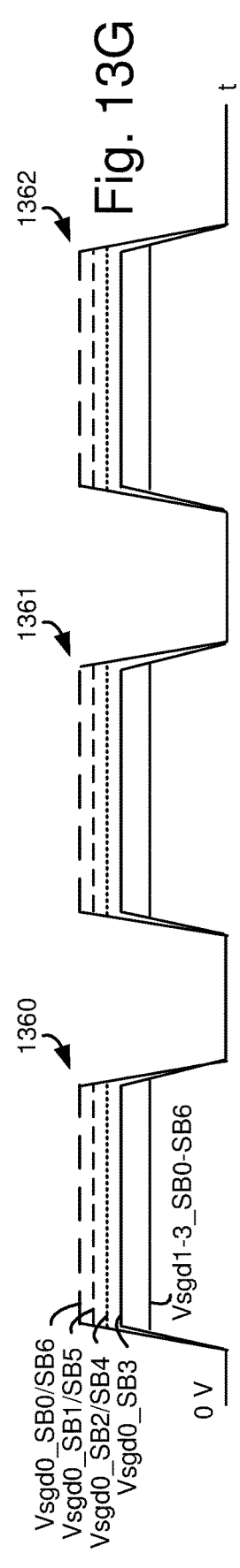
FIG. 13G depicts an example sequence of control gate voltages for select gate transistors, consistent with FIGS. 12C and 13A.

FIG. 13G depicts an example sequence of control gate voltages for select gate transistors, consistent with FIGS. 12C and 13A. FIG. 13G differs from FIG. 13F in that the voltages which represent Vsgd1-3_SB3, Vsgd1-3_SB2/SB4, Vsgd1-3_SB1/SB5 and Vsgd1-3_SB0/SB6 in FIG. 13F may represent Vsgd0_SB3, Vsgd0_SB2/SB4, Vsgd0_SB1/SB5 and Vsgd0_SB0/SB6, respectively, in FIG. 13G. The voltage of the second through fourth SGD transistors, which is common among the sub-blocks SB0-SB6, is represented by Vsgd1-3_SB0-SB6, and is lower than the other SGD voltages. Sets of plots 1360, 1361 and 1362 represents the SGD voltages during EP1, EP2 and EP3, respectively.

FIG. 13G can be modified to be consistent with FIG. 12D by replacing the one voltage, Vsgd1-3_SB0-SB6, with the different values of Vsgd1-3 for SB0/SB6, SB1/SB5, SB2/SB4 and SB3.

In one implementation, an apparatus comprises: a plurality of memory cells arranged in NAND strings in a plurality of sub-blocks of a block, the NAND strings comprise a plurality of concentric layers, the concentric layers comprise a blocking oxide layer, and a thickness of the blocking oxide layer is different in different sub-blocks of the plurality of sub-blocks, each NAND string comprises a channel; and a control circuit. The control circuit is configured to, in an erase operation for the block, charge up channels of NAND strings in the plurality of sub-blocks, including charging up channels of NAND strings in a central sub-block among the plurality of sub-blocks to a higher voltage than a voltage to which channels of NAND strings in one edge sub-block among the plurality of sub-blocks are charged up.

In another implementation, a method comprises: applying a common erase voltage to bit lines connected to drain ends of NAND strings in a plurality of sub-blocks of a block, the NAND strings comprise one or more select gate transistors at the drain ends of the NAND strings; and during the applying of the common erase voltage, applying control gate voltages to the one or more select gate transistors at the drain ends of the NAND strings in each sub-block according to a position of each sub-block in the block.

In another implementation, an apparatus comprises: a plurality of memory cells arranged in NAND strings in a plurality of sub-blocks of a block, each NAND string comprises a channel; and a control circuit. The control circuit is configured to, in an erase operation for the block, charge up channels of NAND strings in each sub-block according to a position of each sub-block in the block.

The foregoing detailed description of the invention has been presented for purposes of illustration and description. It is not intended to be exhaustive or to limit the invention to the precise form disclosed. Many modifications and variations are possible in light of the above teachings. The described embodiments were chosen in order to best explain the principles of the invention and its practical application, to thereby enable others skilled in the art to best utilize the invention in various embodiments and with various modifications as are suited to the particular use contemplated. It is intended that the scope of the invention be defined by the claims appended hereto.

We claim:

1. An apparatus, comprising:
a control circuit configured to connect to a plurality of memory cells, the plurality of memory cells are arranged in NAND strings in a plurality of sub-blocks of a block, the plurality of sub-blocks comprise a central sub-block and an edge sub-block, each NAND string comprises a channel, and the control circuit is configured to:
in an erase operation for the block, charge up channels of NAND strings in the central sub-block to a higher voltage than a voltage to which channels of NAND strings in the edge sub-block are charged up.

2. The apparatus of claim 1, wherein:
the NAND strings comprise a first select gate transistor at a drain-end of the NAND strings;
a pair of the sub-blocks have equal erase speeds; and
control gates of the first select gate transistors in the pair of the sub-blocks having equal erase speeds are connected to one another.

3. The apparatus of claim 1, wherein:
the NAND strings comprise a blocking oxide layer; and
a thickness of the blocking oxide layer is less in the edge sub-block than in the central sub-block.

4. The apparatus of claim 1, wherein:
to charge up the channels of the NAND strings in the central sub-block and to charge up the channels of the NAND strings in the edge sub-block, the control circuit is configured to apply a common erase voltage to the drain ends of the NAND strings in the central sub-block and to the drain ends of the NAND strings in the edge sub-block.

5. The apparatus of claim 1, wherein:
the control circuit is on a different die than the plurality of memory cells.

6. The apparatus of claim 1, wherein:
the NAND strings comprise a first select gate transistor at a drain-end of the NAND strings; and
the control circuit, to charge up the channels of the NAND strings in the central sub-block, is configured to apply a control gate voltage to the first select gate transistors in the NAND strings in the central sub-block and, to charge up the channels of the NAND strings in the edge sub-block, is configured to apply a control gate voltage to the first select gate transistors in the NAND strings in the edge sub-block which is higher than the control gate voltage applied to the first select gate transistors in the NAND strings in the central sub-block.

7. The apparatus of claim 6, wherein:
each NAND string comprises a second select gate transistor adjacent to the first select gate transistor; and
during the charge up of the channels of the NAND strings in the central sub-block, the control circuit is configured to apply a common control gate voltage to the second select gate transistors in the edge sub-block and in the central sub-block.

8. The apparatus of claim 1, wherein:
the NAND strings comprise a first select gate transistor at a drain-end of the NAND strings and a second select gate transistor adjacent to the first select gate transistor;
during the charge up of the channels of the NAND strings in the central sub-block, the control circuit is configured to apply a control gate voltage to the second select gate transistors in the central sub-block; and
during the charge up of the channels of the NAND strings in the edge sub-block, the control circuit is configured to apply a control gate voltage to the second select gate transistors in the edge sub-block which is higher than the control gate voltage applied to the second select gate transistors in the central sub-block.

9. The apparatus of claim 8, wherein:
the charging up of the channels of the NAND strings in the plurality of sub-blocks occurs in a plurality of erase loops;
the control gate voltage applied to the second select gate transistors in the NAND strings in the edge sub-block is stepped up in the plurality of erase loops by a first step size; and
the control gate voltage applied to the second select gate transistors in the NAND strings in the central sub-block is stepped up in the plurality of erase loops by a second step size which is lower than the first step size.

10. The apparatus of claim 1, wherein:
the NAND strings comprise a first select gate transistor at a drain-end of the NAND strings and a second select gate transistor adjacent to the first transistor;
in each NAND string, a control gate of the second select gate transistor is disconnected from a control gate of the first select gate transistor;
the control gates of the first select gate transistors in the edge sub-block are connected to the control gates of the first select gate transistors in the central sub-block; and
the control circuit is configured to, during the charging up of the channels of the NAND strings in the plurality of sub-blocks, apply a common control gate voltage to the first select gate transistors in the edge sub-block and to the first select gate transistors in the central sub-block for generating gate-induced drain leakage at the first select gate transistors in the edge sub-block and at the first select gate transistors in the central sub-block, respectively, and apply a control gate voltage to the second select gate transistors in the edge sub-block which is higher than a control gate voltage applied to the second select gate transistors in the central sub-block.

11. The apparatus of claim 10, wherein:
after the charging up of the channels of the NAND strings in the plurality of sub-blocks, the control circuit is configured to determine one or more sub-blocks which have passed an erase-verify test and one or more sub-blocks which have not passed the erase-verify test and, in response to the determination, continue the erase operation for the one or more sub-blocks which have not passed the erase-verify test while inhibiting a further erasing of the one or more sub-blocks which have passed the erase-verify test.

12. An apparatus, comprising:
a circuit configured to connect to a plurality of memory cells, the plurality of memory cells are arranged in NAND strings in a block, the NAND strings are arranged in multiple rows comprising one row and another row, an edge of the block is closer to the one row than to the another row, and each NAND string comprises a channel; and
a memory interface connected to the circuit, the circuit is configured to issue a command via the memory interface in an erase operation for the block to charge up channels of NAND strings in the another row by a greater amount than an amount to which NAND strings in the one row are charged up.

13. The apparatus of claim 12, wherein:
the block comprises a plurality of sub-blocks; and
the one row and the another row are in a common sub-block of the plurality of sub-blocks.

14. The apparatus of claim 13, wherein:
the common sub-block is an edge sub-block, adjacent to an edge of the block.

15. The apparatus of claim 12, wherein:
the circuit, to charge up the channels of the NAND strings in the another row by the greater amount than the amount to which the NAND strings in the one row are charged up, is configured to issue a command via the memory interface to apply an erase voltage to drain ends of the NAND strings in the another row which is higher than an erase voltage which is applied concurrently to drain ends of the NAND strings in the one row.

16. The apparatus of claim 12, wherein:
the multiple rows of NAND strings each comprise a first select gate transistor at a drain-end of the multiple rows of NAND strings; and
control gates of the first select gate transistors are connected to one another.

17. The apparatus of claim 12, wherein:
the NAND strings comprise a blocking oxide layer; and
a thickness of the blocking oxide layer is less in the one row than in the another row.

18. A method, comprising:
performing an erase operation for a plurality of memory cells, the plurality of memory cells are arranged in NAND strings in different sub-blocks of a block, each NAND string comprises a channel and a blocking oxide layer, and a thickness of the blocking oxide layer is different in the different sub-blocks, the performing the erase operation comprises charging up the channels of the NAND strings in each sub-block according to a position of each sub-block in the block.

19. The method of claim 18, wherein:
the charging up the channels comprises generating an amount of gate-induced drain leakage at select gate transistors of the NAND strings in each sub-block according to the position of each sub-block in the block.

20. The method of claim 18, wherein the charging up the channels comprises:
applying a common erase voltage to bit lines connected to drain ends of the NAND strings in each sub-block; and
during the applying of the common erase voltage, applying different control gate voltages to one or more select gate transistors at the drain ends of the NAND strings in the different sub-blocks.

* * * * *